(12) United States Patent
Liaw

(10) Patent No.: US 9,418,728 B2
(45) Date of Patent: Aug. 16, 2016

(54) DUAL-PORT STATIC RANDOM-ACCESS MEMORY CELL

(71) Applicant: Taiwan Semiconductor Manufacturing Company, Ltd., Hsin-Chu (TW)

(72) Inventor: Jhon Jhy Liaw, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 118 days.

(21) Appl. No.: 14/339,883

(22) Filed: Jul. 24, 2014

(65) Prior Publication Data

US 2016/0027499 A1    Jan. 28, 2016

(51) Int. Cl.
| | | |
|---|---|---|
| G11C 11/412 | (2006.01) |
| H01L 27/11 | (2006.01) |
| H01L 29/78 | (2006.01) |
| G11C 5/06 | (2006.01) |
| G11C 8/14 | (2006.01) |
| G11C 8/16 | (2006.01) |

(52) U.S. Cl.
CPC .............. *G11C 11/412* (2013.01); *G11C 5/063* (2013.01); *G11C 8/14* (2013.01); *G11C 8/16* (2013.01); *H01L 27/1104* (2013.01); *H01L 29/785* (2013.01)

(58) Field of Classification Search
CPC .. G11C 11/412; G11C 5/063; H01L 27/0886; H01L 27/1104
See application file for complete search history.

(56) References Cited

U.S. PATENT DOCUMENTS

| | | | |
|---|---|---|---|
| 8,009,463 B2 | 8/2011 | Liaw | |
| 8,059,452 B2 | 11/2011 | Liaw | |
| 8,183,639 B2* | 5/2012 | Malinge | H01L 27/11 257/347 |
| 8,315,084 B2* | 11/2012 | Liaw | G11C 11/412 365/154 |
| 8,675,397 B2 | 3/2014 | Liaw | |
| 9,041,115 B2* | 5/2015 | Liaw | G11C 11/412 257/369 |
| 9,076,552 B2* | 7/2015 | Schaefer | G11C 11/412 |
| 9,257,439 B2* | 2/2016 | Liaw | H01L 27/1104 |
| 2015/0357279 A1* | 12/2015 | Fujiwara | G06F 17/5077 257/499 |

* cited by examiner

*Primary Examiner* — Allison P Bernstein
(74) *Attorney, Agent, or Firm* — Haynes and Boone, LLP

(57) ABSTRACT

The present disclosure provides a static random access memory (SRAM) cell comprising a first inverter including a first pull-up (PU) device, a first pull-down (PD) device, and a second PD device; a second inverter cross-coupled to the first inverter, the second inverter including a second PU device, a third PD device, and a fourth PD device; first and second pass gate (PG) devices coupled to the first inverter to form a first port; and third and fourth PG devices coupled to the second inverter to form a second port. The first and second PG devices, the first PD device of the first inverter, and the third PD device of the second inverter are configured on a first active region. The third and fourth PG devices, the second PD device of the first inverter, and the fourth PD device of the second inverter are configured on a second active region.

20 Claims, 16 Drawing Sheets

DUAL-PORT STATIC RANDOM-ACCESS MEMORY CELL

BACKGROUND

In deep sub-micron integrated circuit technology, an embedded static random access memory (SRAM) device has become a popular storage unit of high speed communication, image processing and system-on-chip (SOC) products. For example, a dual port (DP) SRAM device allows parallel operation, such as 1 R (read) 1 W (write), or 2 R (read) in one cycle, and therefore has higher bandwidth than a single port SRAM. In advanced technologies with decreased feature size and increased packing density, low loading and high speed of the cell structure are important factors in embedded memory and SOC products. The thin style SRAM cell structure with short bit line (BL) provides better performance on BL RC delay. However, the thin style cell structure suffers from some problems including data node leakage, devices matching of pull-down (PD)/pass-gate (PG) devices and current crowding, etc. Special operation mode (parallel operation) of the DP SRAM requests more pull down drive capability to cover two-ports of the ON operation mode. This further requires double beta ratio setting for static noise margin (SNM). As such, the PD device width will be around 2× from the single-port cell. This results in an L-shape or T-shape layout of the drain node of the PD device, and therefore may suffer the above problems. In addition, the SRAM cell may encounter numerous difficulties during the lithography process. It is therefore desired to have a new structure to address the above issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
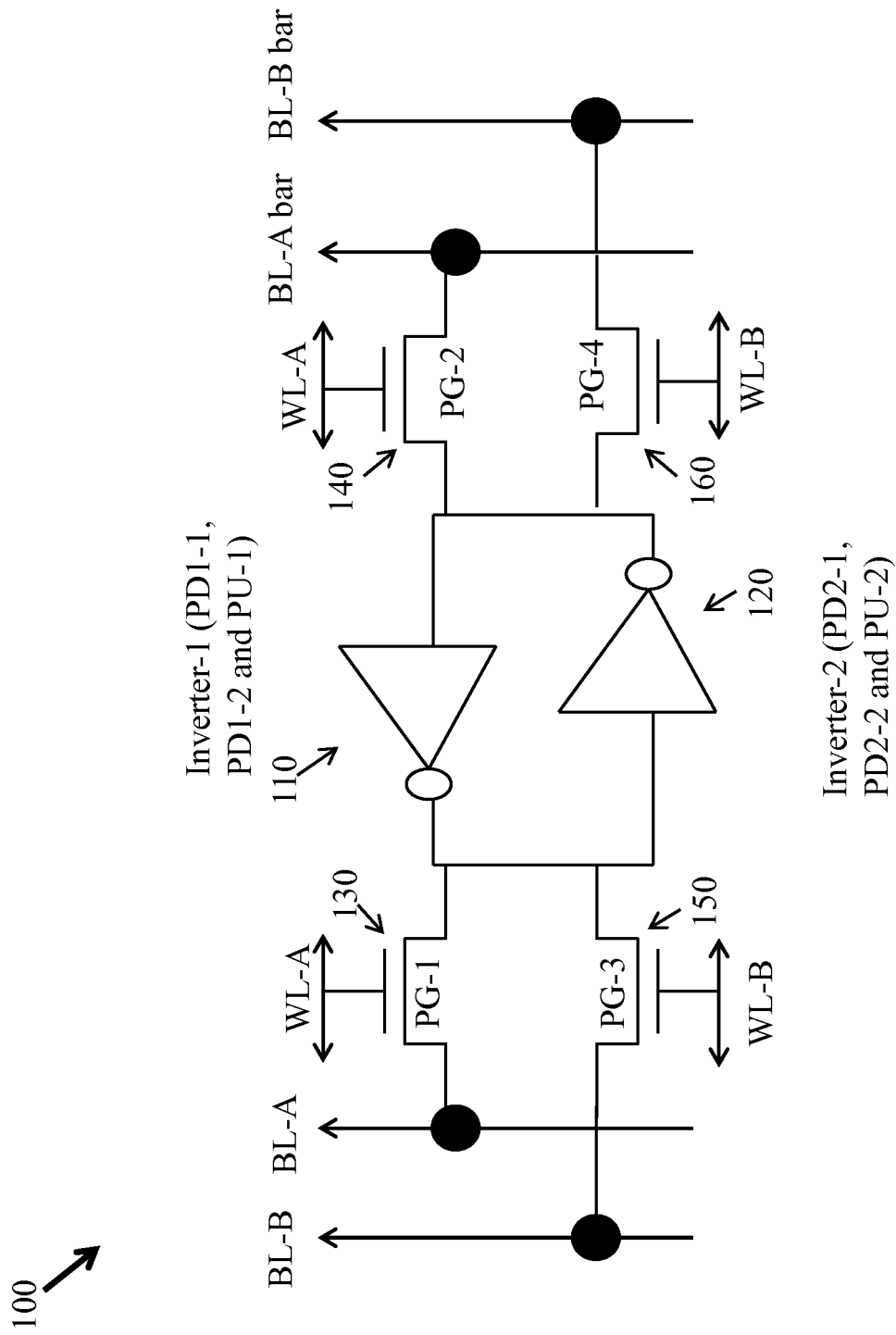
FIGS. 1-2 are schematic views of a dual port static random access memory (DP SRAM) device constructed according some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
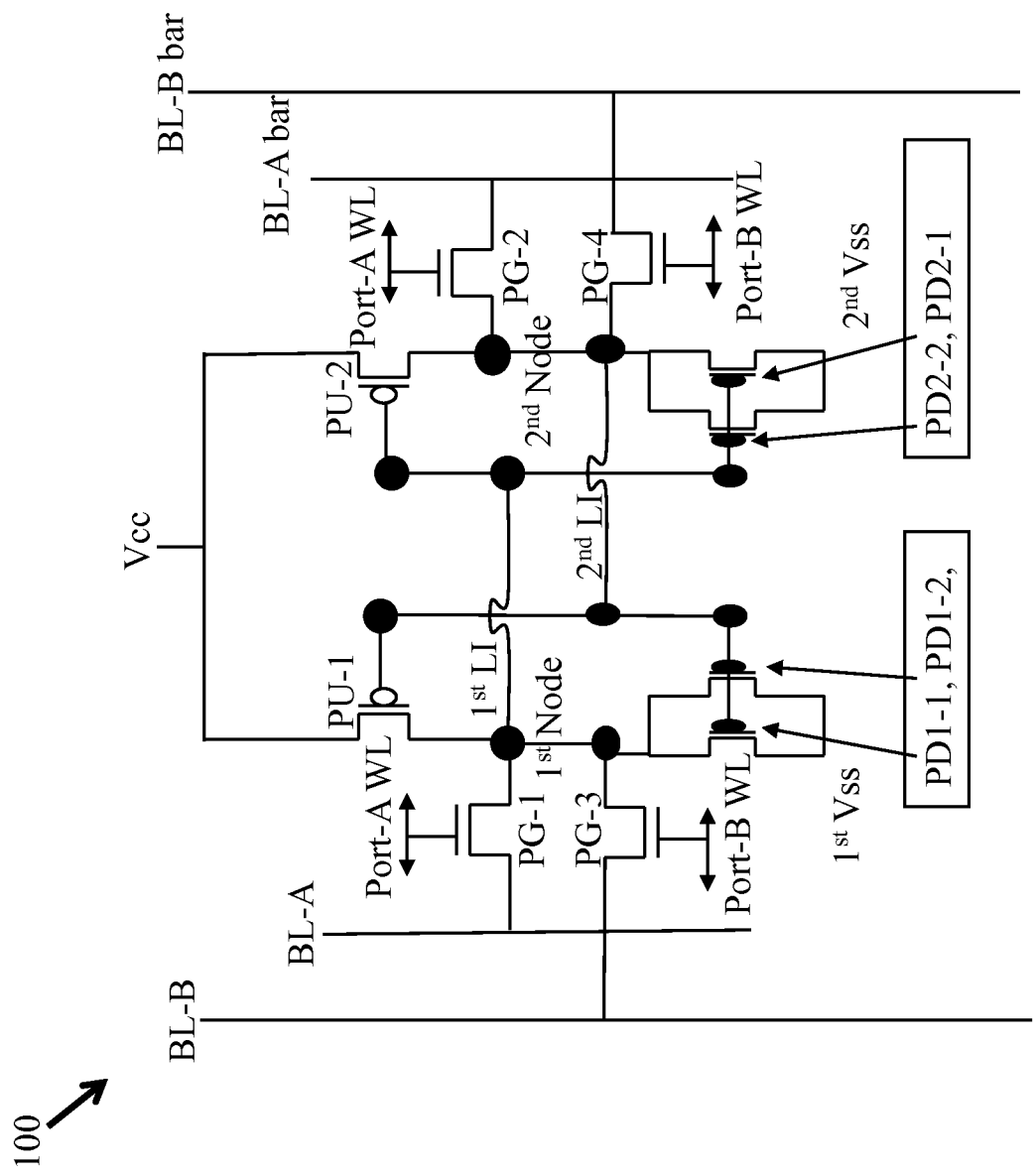

FIGS. 1-2 are schematic views of a dual-port (DP) static random access memory (SRAM) cell 100 constructed according to some embodiments of the present disclosure. The DP SRAM cell 100 includes a first inverter 110 and a second inverter 120 that are cross-coupled. The first inverter 110 includes a first pull-up (PU) device formed with a p-type metal-oxide-semiconductor field-effect transistor (PMOSFET), referred to as PU-1. The first inverter 110 also includes a plurality of first pull-down (PD) devices formed with n-type MOSFET (NMOSFET) and configured in parallel mode, referred to as PD1-1 and PD1-2. The second inverter 120 includes a second PU device formed with a PMOSFET, referred to as PU-2. The second inverter 120 also includes a plurality of second PD devices formed with NMOSFETs and configured in parallel mode, referred to as PD2-1 and PD2-2.

Still referring to FIGS. 1-2, the drains of PU-1, PD1-1, and PD1-2 are electrically connected together, defining a first drain node (or first node, referred to $1^{st}$ Node). The drains of PU-2, PD2-1, and PD2-2 are electrically connected together, defining a second drain node (or second node, referred to $2^{nd}$ Node). The gates of PU-1, PD1-1, and PD1-2 are electrically connected and coupled to the second node ($2^{nd}$ Node). The gates of PU-2, PD-21, PD-22 and PD-23 are electrically connected and coupled to the first node ($1^{st}$ Node). The sources of PU-1 and PU-2 are electrically connected to the power line (Vcc line). The sources of PD1-1, PD1-2, PD2-1, and PD2-2 are electrically connected to a complementary power line (Vss line). In some embodiments as shown in FIG. 2, the sources of PD1-1 and PD1-2 are electrically connected to a first Vss line while the sources of PD2-1 and PD2-2 are electrically connected to a second Vss line.

As shown in FIG. 2, the DP SRAM cell 100 further includes a first port (port-A) and a second port (port-B). In some embodiments, port-A includes at least two pass-gate (PG) devices, referred to as PG-1 and PG-2, and port-B includes at least two PG devices, referred to as PG-3 and PG-4. Each of the PG devices may include a NMOSFET. In some embodiments, the drain of PG-1 is electrically connected to a first bit line (referred to as BL-A), the source of PG-1 is electrically connected to the first node ($1^{st}$ Node), and the gate of PG-1 is electrically connected to a first word line (referred to as port-A WL). The drain of PG-2 is electrically connected to a first bit line bar (BL-A bar), the source of PG-2 is electrically connected to the second node ($2^{nd}$ Node), and the gate of PG-2 is electrically connected to the first word line (port-A WL). The drain of PG-3 is electrically connected to a second bit line (BL-B), the source of PG-3 is electrically connected to the first node ($1^{st}$ Node), and the gate of PG-3 is electrically connected to a second word line (port-B WL). The drain of PG-4 is electrically connected to a second bit line bar (BL-B bar), the source of PG-4 is electrically connected to the second node ($2^{nd}$ Node), and the gate of PG-4 is electrically connected to the second word line (port-B WL). The word lines and the bit lines may serve the read and/or write functionalities.

Various NMOSFETs and PMOSFETs may be formed by any proper technology. In some embodiments, the NMOSFETs and PMOSFETs may be conventional MOFETs. The various NMOSFETs and PMOSFETs may be formed using high-k/metal gate technology. In some alternative embodiments, the various NMOSFETs and PMOSFETs may include Fin-like field effect transistors (FinFETs). The FinFETs may be formed by a process including depositing a dielectric material layer on the semiconductor substrate, etching the dielectric material layer to form openings thereof, selective epitaxy growing a semiconductor material (such as silicon) on the semiconductor substrate within the openings to form fin active regions and STI features. The various FinFETs may also include strained features for enhanced mobility and device performance. For example, the pFinFETs may include epitaxy grown silicon germanium on a silicon substrate. In some embodiments, the DP SRAM cell 100 may include additional devices such as additional PD devices and PG devices.

Figure 3A:
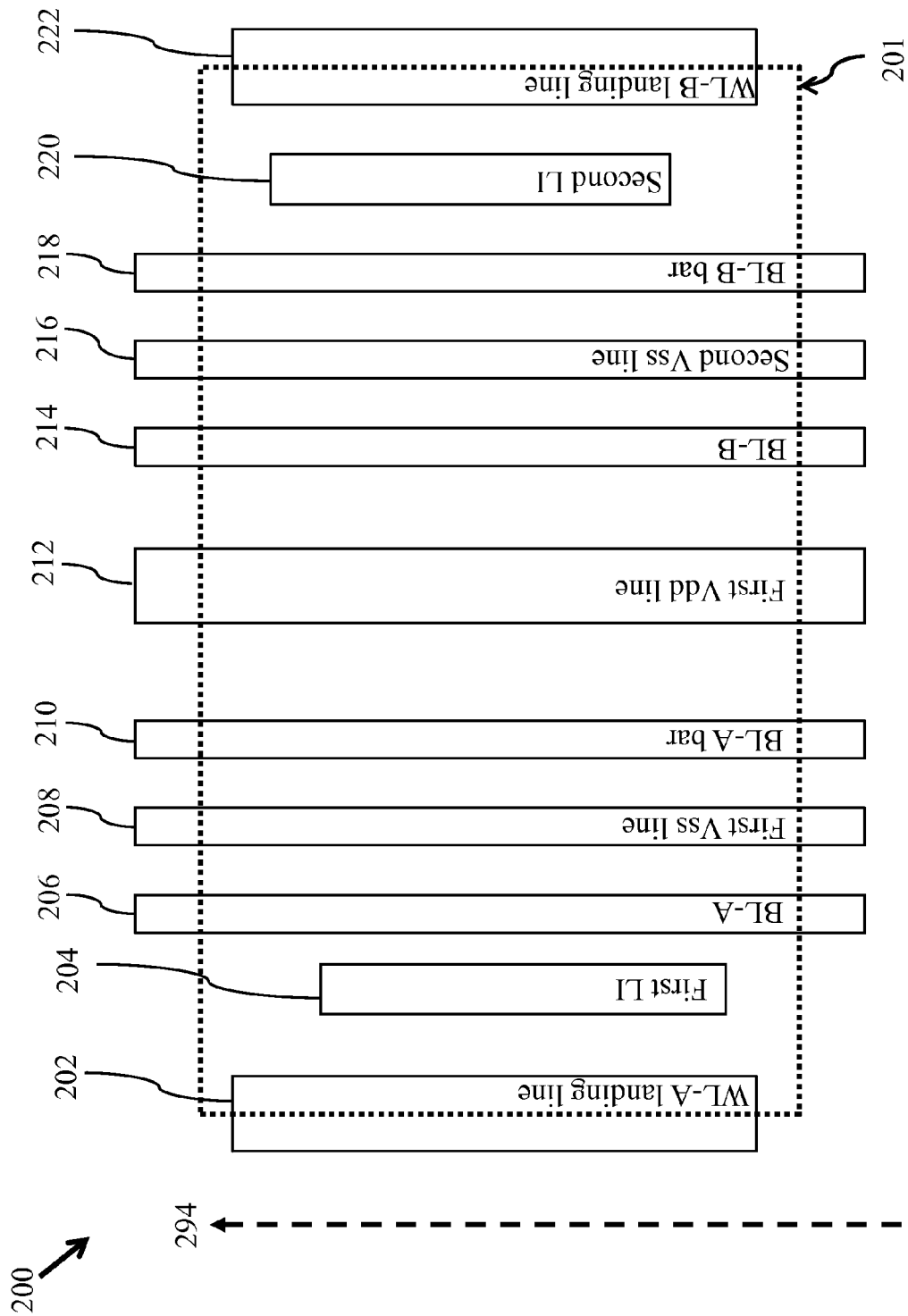
FIG. 3A is a top view of a metal routing structure formed in a DP SRAM cell according to some embodiments of the present disclosure.

FIG. 3A is a top view of a metal routing structure 200 formed in a metal layer (e.g., M1) of the DP SRAM cell 100 according to some exemplary embodiments of the present disclosure. Referring to FIG. 3A, a plurality of metal lines 202-222 may be formed in the first metal layer M1 and substantially aligned in a first dimension 294.

Still referring to FIG. 3A, in some embodiments, the first metal layer M1 of the PD SRAM cell 100 includes a first word line landing line (WL-A landing line) 202, a first local interconnect (LI) 204, a first bit line (BL-A) 206, a first Vss line 208, a first bit line bar (BL-A bar) 210, a first Vdd line 212, a second bit line (BL-B) 214, a second Vss line 216, a second bit line bar (BL-B bar) 218, a second local interconnect (LI) 220, and a second word line landing line (WL-B landing line) 222. In some embodiments, the metal lines 202-222 are arranged in the first metal layer M1 in a sequence as discussed with regard to FIG. 3. The metal line routing structure 200 of FIG. 3 may be applicable to the PD SRAM cell having the multiple PD devices from the same inverter distributed separately in different active regions. For example as discussed later in the present disclosure, the first PD device PD1-1 of the first inverter inverter-1 may be formed on a first active region, and the second PD device PD1-2 of the first inverter inverter-1 may be formed on a second active region. The metal lines of the metal line routing structure 200 in the first metal layer M1 are straight lines, thus may be beneficial for lithography patterning to provide uniform density and uni-dimensional routing in the patterns.

In some embodiments, the first word line landing line (WL-A landing line) 202 and the second word line landing line (WL-B line) 222 may be used to electrically connect the gate structures formed under the first metal layer M1 to the one or more word lines formed in the second metal layer M2 and over the first metal layer M1. The first word line landing line (WL-A landing line) 202 and the second word line landing line (WL-B line) 222 may be formed on the boundary 201 of the cell as shown in FIG. 3A. The first Vdd line 212 may be substantially positioned in the center portion of the PD SRAM cell 100 in the first metal layer M1. In some embodiments, the metal lines 202-222 in the first metal layer M1 are substantially aligned along the first dimension 294. In the present embodiment, at least one of the Vdd line and the Vss line is configured between the two adjacent bit lines in the first metal layer M1 for noise shielding. For example, the first Vss line 208 is formed between the first bit line (BL-A) 206 and the first bit line bar (BL-A bar) 210, the first Vdd line 212 is formed between the first bit line bar (BL-A bar) 210 and the second bit line (BL-B) 214, and the second Vss line 216 is formed between the second bit line (BL-B) 214 and the second bit line bar (BL-B bar) 218.

Figure 3B:
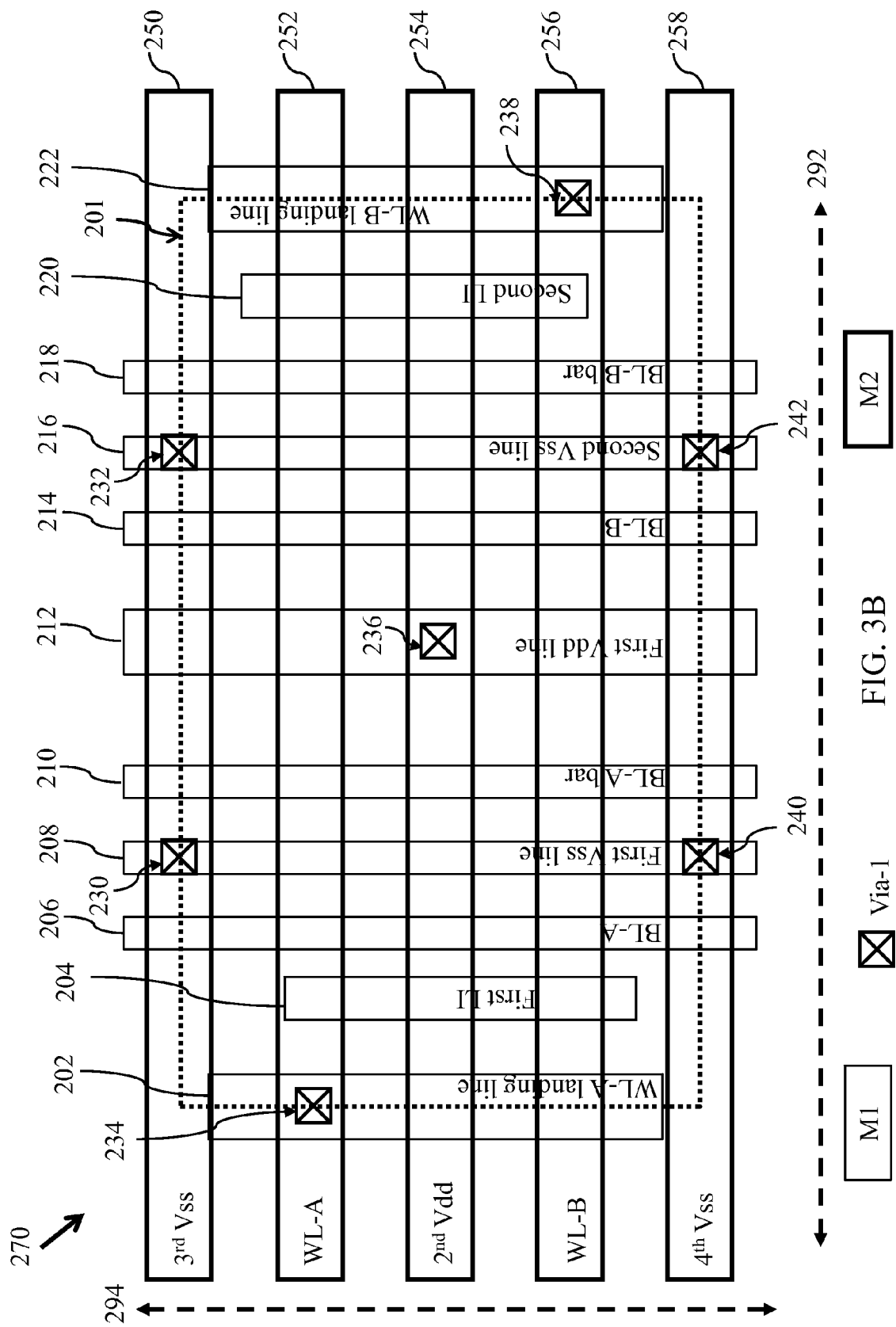
FIGS. 3B-3C are top views of one or more metal layers including metal routing structures in a DP SRAM cell according to some embodiments of the present disclosure.
Figure 3C:
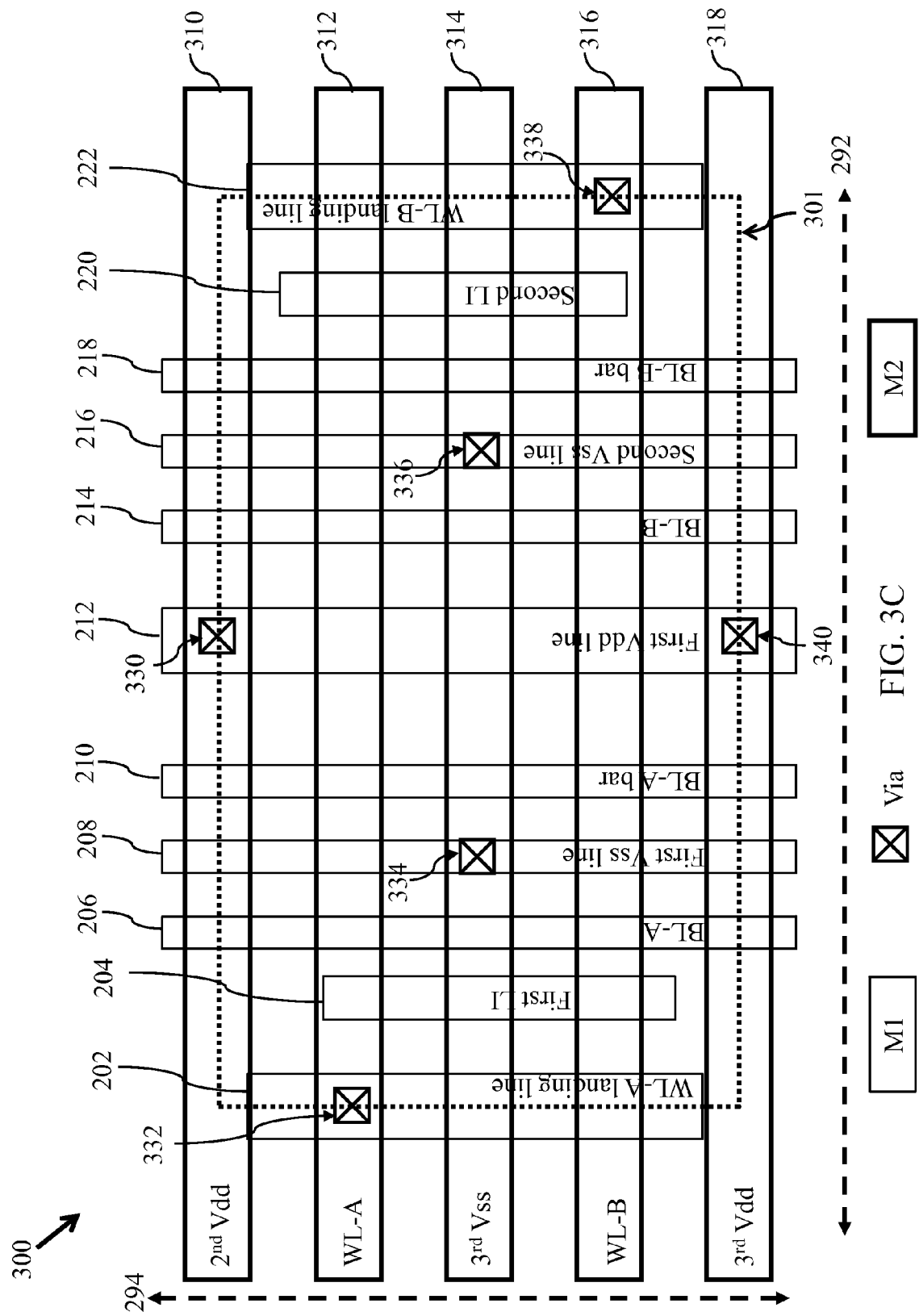

FIGS. 3B-3C are top views of one or more metal layers including metal routing structures formed over the first metal layer M1 in the DP SRAM cell according to some embodiments of the present disclosure. In some embodiments as shown in FIG. 3B, the DP SRAM cell 100 includes at least two interconnect layers, i.e. a first metal layer M1 and a second metal layer M2 formed over the first metal layer M1. A metal routing structure 270 may include a plurality of metal lines 250-258 formed in the second metal layer M2 over the first metal layer M1. The metal lines 250-258 may be substantially aligned in a second dimension 292. The second dimension 292 may be substantially perpendicular to the second dimension 294 as shown in FIGS. 3B-3C.

In some embodiments as shown in FIG. 3B, the second metal layer M2 of the PD SRAM cell 100 includes a third Vss line 250, a first word line 252 (WL-A), a second Vdd line 254, a second word line 256 (WL-B), and a fourth Vss line 258. The third Vss line 250 and the fourth Vss line 258 may be formed on the boundary 201 of the bit cell. The second Vdd line 254 may be substantially positioned in the center portion of the PD SRAM cell 100 in the second metal layer M2. In some embodiments, the metal lines 250-258 in the second metal layer M2 are all substantially aligned along the second dimension 292 which is substantially perpendicular to the first dimension 294. In some embodiments, the metal lines 250-258 are arranged in the second metal layer M2 in a sequence as shown in FIG. 3B. In the present embodiment, at least one of the Vdd line and the Vss line is configured between the two adjacent word lines in the second metal layer M2. For example, the second Vdd line 254 may be formed between the first word line 252 (WL-A) and the second word line 256 (WL-B). The Vss lines and the Vdd lines may serve as power lines to provide and route power in the DP SRAM cell. In various embodiments, the metal lines in the first metal layer M1 and/or the second metal layer M2 may have different configurations.

Still referring to FIG. 3B, various vias for coupling the first metal layer M1 to the second metal layer M2 are properly configured and formed on the first metal layer M1. In some embodiments, the vias on the first metal layer M1 include a first via 230 and a second via 232 landing on the first Vss line 208 and the second Vss line 216 respectively for coupling the third Vss line 250 to the first Vss line 208 and the second Vss line 216 respectively. A third via 234 may be landing on the first word line landing line 202 (WL-A landing line) for coupling the first word line 252 (WL-A) to the first word line landing line 202 (WL-A landing line). A fourth via 236 may be landing on the first Vdd line 212 for coupling the first Vdd line 212 to the second Vdd line 254. A fifth via 238 may be landing on the second word line landing line 222 (WL-B landing line) for coupling the second word line 256 (WL-B)

to the second word line landing line 222 (WL-B landing line). A sixth via 240 and a seventh via 242 may be landing on the first Vss line 208 and the second Vss line 216 for coupling the fourth Vss line 258 to the first Vss line 208 and the second Vss line 216 correspondingly. The various metal lines may be configured and/or assigned differently according to the configurations of the various PU devices, PD devices, and PG devices. It is noted that vias 230-242 are located between metal layers M1 and M2 to serve as a connection path. Thus, these vias are landed on M1 and under M2.

FIG. 3C is a top view of an metal routing structure 300 formed on one or more metal layers (e.g., metal layer M1) of the DP SRAM cell 100 according to some exemplary embodiments of the present disclosure. In some embodiments as shown in FIG. 3C, the DP SRAM cell 100 includes at least two interconnect layers, i.e. a first metal layer M1 and a second metal layer M2 formed over the first metal layer M1. A metal routing structure 300 may include a plurality of metal lines 310-318 formed in the second metal layer M2 over the first metal layer M1. The metal lines 310-318 may be substantially aligned in a second dimension 292. The second dimension 292 may be substantially perpendicular to the second dimension 294 as shown in FIGS. 3B-3C.

In one embodiments as shown in FIG. 3C, the second metal layer M2 of the PD SRAM cell 100 includes a second Vdd line 310, a first word line 312 (WL-A), a third Vss line 314, a second word line 316 (WL-B), and a third Vdd line 318. The second Vdd line 310 and the third Vdd line 318 may be on the boundary 301 of the bit cell as shown in FIG. 3C. The third Vss line 314 may be substantially positioned in the center portion of the PD SRAM cell 100 on the second metal layer M2 of the cell. In some embodiments, the metal lines 310-318 in the second metal layer M2 are all substantially aligned along the second dimension 292 that is substantially perpendicular to the first dimension 294. In some embodiments, the metal lines 310-318 are arranged in the second metal layer M2 in a sequence as discussed with regard to FIG. 3C. In various embodiments, the metal lines in the first metal layer M1 and/or the second metal layer M2 may have different configurations. In the present embodiment, at least one of the Vdd line and the Vss line is configured between the two adjacent word lines in the second metal layer M2. For example, the third Vss line 314 is configured between the first word line 312 (WL-A) and the second word line 316 (WL-B).

Still referring to FIG. 3C, various vias for coupling the first metal layer M1 to the second metal layer M2 are properly configured and formed on the first metal layer M1. In some embodiments, the vias on the first metal layer M1 include a first via 330 landing on the first Vdd line 212 for coupling the second Vdd line 310 in the second metal layer M2 to the first Vdd line 212 in the first metal layer M1. A second via 332 may be landing on the first word line landing line 202 (WL-A landing line) for coupling the first word line 312 (WL-A) in the second metal layer M2 to the first word line landing line 202 (WL-A landing line). A third via 334 and a fourth via 336 may be landing on the first Vss line 208 and the second Vss line 216 for coupling the third Vss line 314 in the second metal layer M2 to the first Vss line 208 and the second Vss line 216 correspondingly. A fifth via 338 may be landing on the second word line landing line 222 (WL-B landing line) for coupling the second word line 316 (WL-B) to the second word line landing line 222 (WL-B landing line). A sixth via 340 may be landing on the first Vdd line 212 for coupling the third Vdd line 320 to the first Vdd line 212. It is noted that vias 330-340 are located between metal layer M1 and M2 to serve as a connection path. Thus, these vias are landed on metal layer M1 and under metal layer M2.

Figure 4A:
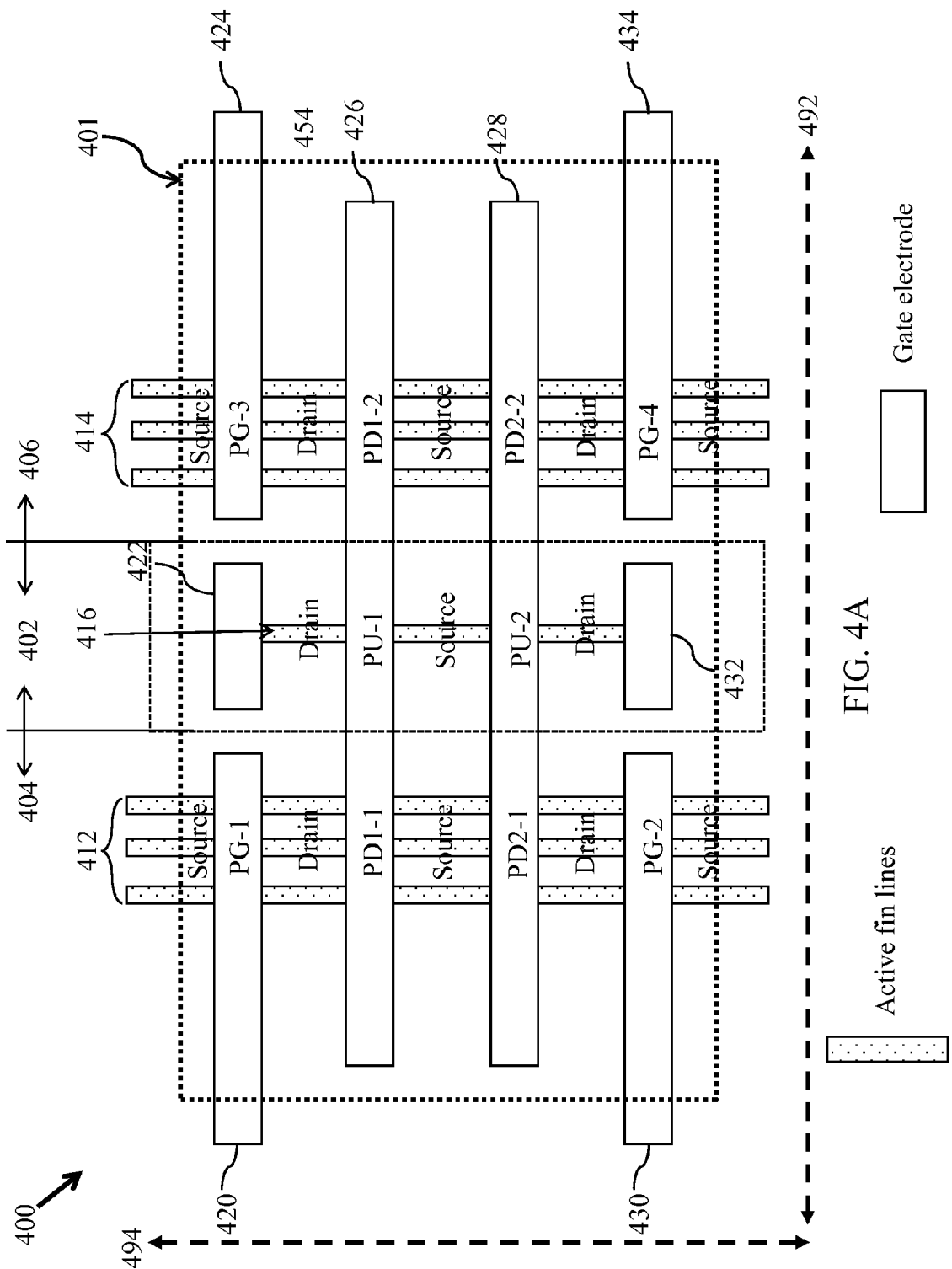
FIGS. 4A-4C are top views of a DP SRAM cell constructed according to some embodiments of the present disclosure.

FIG. 4A is a top view of a DP SRAM cell 400 including various device designed according to various embodiments of the present disclosure. In one embodiment, the DP SRAM cell 400 may be a portion of the DP SRAM cell 100 of FIG. 2 in an embodiment. The DP SRAM cell 400 includes one cell of DP SRAM and is formed on a semiconductor substrate. The semiconductor substrate may include silicon. Alternatively, the substrate may include germanium, silicon germanium or other proper semiconductor materials. The semiconductor substrate may include other proper features and structures. In one embodiment, the semiconductor substrate employs a layer of semiconductor material formed over an insulating layer on a supporting bulk wafer for isolation. The technology and structure are referred to as semiconductor on isolation (SOI). The SOI structure can be formed by different techniques including separation by implanted oxygen (SIMOX), bonding and etching back (BESOI), and zone melting and recrystallization (ZMR).

Referring to FIG. 4A, the DP SRAM cell 400 is formed in a unit cell region, defined by the unit cell boundary 401. In one embodiment, the unit cell region is defined in a rectangular shape with a first dimension 492 along a first direction and with a second dimension 494 along a second direction substantially perpendicular to the first direction. In some embodiments, the first dimension 492 may be longer than the second dimension 494. The first dimension 492 and the second dimension 494 may be referred to as a longer pitch and a shorter pitch, respectively. The SRAM cell 400 includes an N-well region 402 disposed in the central portion of the cell. The SRAM cell 400 further includes P-well regions 404 and 406 disposed on two sides of the N-well region 402. In some embodiments, the N-Well region 402 and P-well regions 404 and 406 may also be extended to multiple cells beyond the unit cell boundary 401. For example, the N-Well region 402 and P-well regions 404 may be extended to more than one cell in the second direction.

Various active regions are defined in the substrate by isolation features and are isolated from each other by the isolation features. The isolation features are formed in the semiconductor substrate with a proper technology. In one embodiment, the isolation features are formed by a shallow trench isolation (STI) technique. In another embodiment, the isolation features are alternatively formed by a local oxidation of silicon (LOCOS) technique. In yet another embodiment, the formation of the STI features includes etching a trench in a substrate and filling the trench by one or more insulator materials such as silicon oxide, silicon nitride, or silicon oxynitride. The filled trench may have a multi-layer structure such as a thermal oxide liner layer with silicon nitride filling the trench. The active regions are defined in the semiconductor substrate upon the formation of the isolation features.

In some embodiments, the DP SRAM cell 400 includes fin active regions (fin active features) to form fin transistors, such as FinFETs. The fin active regions are formed on the semiconductor substrate and defined within the SRAM cell 400. The fin active regions are formed by a suitable technology and may be formed in a process to form both the STI features and the fin active regions. In one embodiment, the fin active regions are formed by a process including etching a semiconductor to form trenches, partially filling the trenches to form shallow trench isolation (STI) features. In furtherance of the present embodiment, an epitaxy semiconductor layer is selectively formed on the fin active region. In another embodiment, the fin active regions are formed by a process including depositing a dielectric material layer on a semiconductor substrate, etching the dielectric material layer to form openings thereof, and selective epitaxy growing a semiconductor material (such as silicon) on the semiconductor substrate within the openings to form fin active regions and the isolation features. In yet another embodiment, the various FinFETs may include strained features for enhanced mobility and device performance. For example, the pFinFETs include epitaxy grown silicon germanium on a silicon substrate. The pFinFETs include epitaxy grown silicon carbide on the silicon substrate.

Still referring to FIG. 4A, the DP SRAM cell 400 includes a first active region 412 formed in the P-well region 404, and a second active region 414 formed in the P-well region 406. A third active region 416 is formed in the N-well region 402 and disposed between the first active region 412 and the second active region 414. In some embodiments, each of the first active region 412, the second active region 414, and the third active region 416 is extending along the second dimension 494. In some embodiments, the first active region 412, the second active region 414, and the third active region 416 or a subset thereof may be extended to multiple cells, such as four or more cells in the second dimension 494.

In some embodiments as shown in FIG. 4A, each of the first active region 412 and the second active region 414 includes one or more fin active features configured to form various FinFETs. The one or more fin active features of the first active region 412, the one or more fin active features of the second active region 414, and the fin active feature of the third active region 416 may extend along the second dimension 494 in the PD SRAM cell 400.

Still referring to FIG. 4A, in some embodiments, various gate features are formed on the active regions in the DP SRAM cell 400 to form various nFinFETs and pFinFETs. A gate feature may include a gate dielectric layer (such as silicon oxide) and a gate electrode (such as doped polysilicon) disposed on the gate dielectric layer. In another embodiment, the gate feature alternatively or additionally includes other suitable materials for circuit performance and manufacturing integration. For example, the gate dielectric layer may include a high-k dielectric material layer. The gate electrode may include metal, such as aluminum, copper, tungsten or other proper conductive material.

As shown in FIG. 4A, various gates are formed to extend along the first dimension 492 and configured with the active regions to form the PU devices, PD devices and PG devices. In the present embodiment, a gate 420 is disposed over the one or more fin active features of the first active region 412 to form PG-1. A gate 424 is disposed over the one or more fin active features of the second active region 414 to form PG-3. A gate 430 is disposed over the one or more fin active features of the first active region 412 to form PG-2. Similarly, a gate 434 is disposed over the one or more fin active features of the second active region 414 to form PG-4. A long gate 426 is formed to extend over the first active region 412, the third active region 416, and the second active region 414 to form PD1-1, PU-1, and PD1-2, respectively. Similarly, a long gate 428 is formed to extend over the first active region 412, the third active region 416, and the second active region 414 to form PD2-1, PU-2, and PD2-2 respectively. In some embodiments as shown in FIG. 4A, each length of the gates 420, 464, 430, and 434 is substantially shorter than each length of the gates 426 and 428. As shown in FIG. 4A, the PG-1, PD1-1, PD2-1 and PG-2 are formed in the first active region 412, the PG-3, PD1-2, PD2-2, and PG-4 are formed in the second active region 414, and the PU-1 and PU-2 are formed in the third active region 416 disposed between the first active region 412 and the third active region 414. In some embodiments, one or more PU devices have a dummy gate (e.g., drain-side devices 422 and 432), which can improve stability.

Still referring to FIG. 4A, various interconnect structures may be utilized to couple the nFinFETs and pFinFETs to form the functional DP SRAM cell. In some embodiments, the drain of PG-1 may be electrically and physically connected to the drain of the PD1-1 by sharing a common doped region defined in the one or more fin active features of active region 412 and positioned between the PG-1 and PD1-1. The drain of PG-2 may be electrically and physically connected to the drain of the PD2-1 by sharing a common doped region defined in the one or more fin active features of active region 412 and positioned between the PG-2 and PD2-1. The source of the PD1-1 and PD2-1 may be formed as a common doped source region defined in the one or more fin active features of active region 412 and positioned between the PD1-1 and PD2-1.

Similarly, in some embodiments as shown in FIG. 4A, the drain of PG-3 may be electrically and physically connected to the drain of the PD1-2 by sharing a common doped region defined in the one or more fin active features of active region 414 and positioned between the PG-3 and PD1-2. The drain of PG-4 may be electrically and physically connected to the drain of the PD2-2 by sharing a common doped region defined in the one or more fin active features of active region 414 and positioned between the PG-4 and PD2-2. The source of the PD1-2 and PD2-2 may be formed as a common doped source region defined in the one or more fin active features of active region 414 and positioned between the PD1-2 and PD2-2.

Figure 4B:
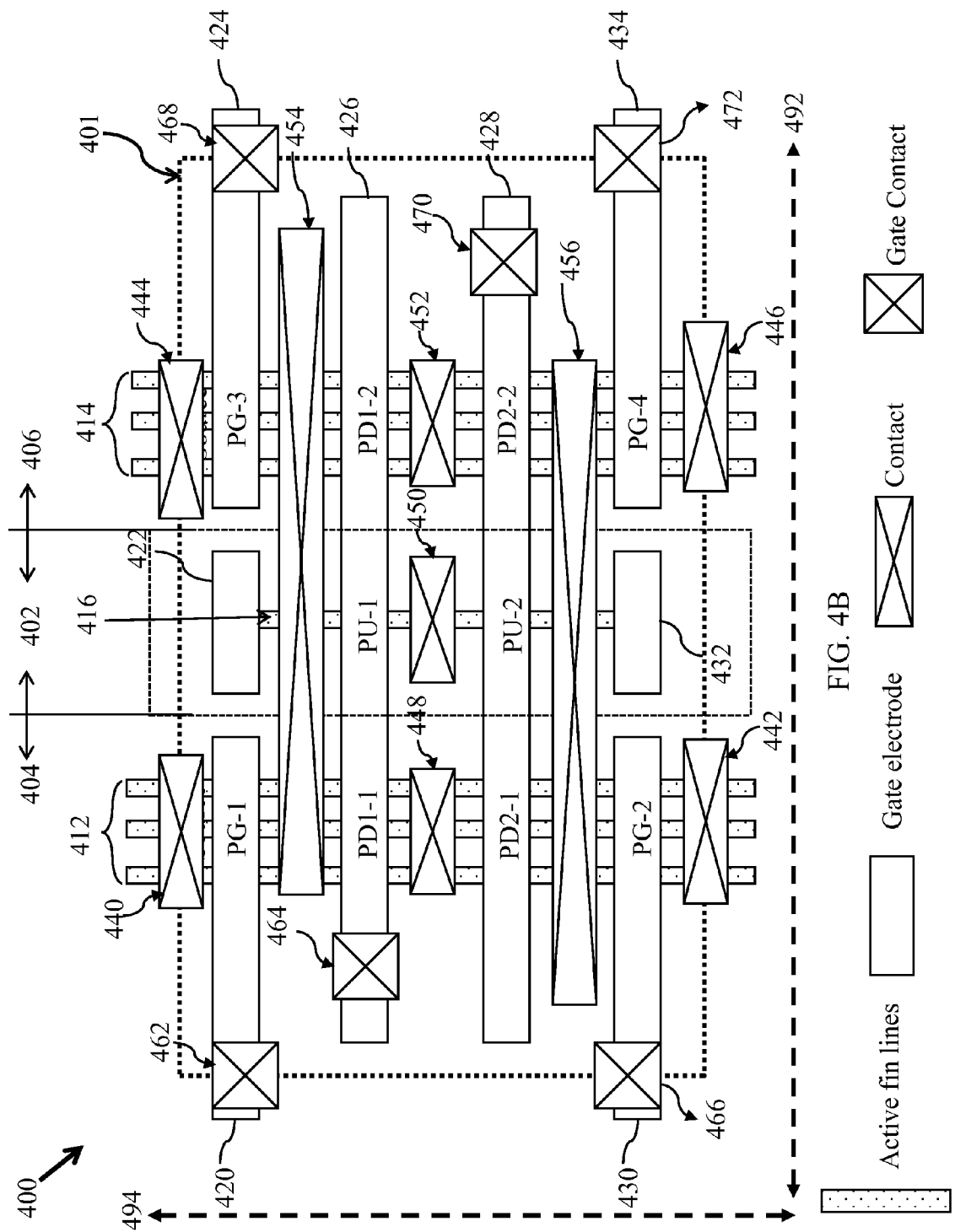

FIG. 4B is a top view of a DP SRAM cell 400 including various device and contact features designed according to various embodiments of the present disclosure. Referring to FIG. 4B, the DP SRAM cell 400 further includes various contacts on gates, source region, and/or drain regions. The contact features are positioned and configured for routing including electrically connecting the doped regions or the gates to a metal layer. Additionally or alternatively, the contact features are designed to have various geometries to function as a local interconnect. In some embodiments, a silicide feature (not shown) may be used to form the contact for the gate, source region, and/or drain region. The silicide feature may be formed by a process known in the art such as self-aligned silicide (salicide) and can be formed together with other contact silicide in a same processing procedure.

In some embodiments, one or more contact features are formed over the corresponding active region and the doped regions for electrically connecting the doped regions of the PG devices, PD devices, and/or the PU device. For example, contact 440 may function as a source contact for routing the doped source region of PG-1 to the bit line 206 (BL-A) in the first metal layer M1 as later discussed in FIG. 4B. Contact 442 may function as a source contact for routing the doped source regions of PG-2 to the bit line bar 210 (BL-A bar) in the first metal layer M1. Contact 444 may function as a source contact for routing the doped source regions of PG-3 to the bit line 214 (BL-B) in the first metal layer M1. Contact 446 may function as a source contact for routing the doped source regions of PG-4 to the bit line bar 218 (BL-B bar) in the first metal layer M1. Contact 448 may function as a source contact for electrically connecting PD1-1 and PD2-1, and the contact 448 may be used for routing the doped source region to the first Vss line 208 in the first metal layer M1. The contact 450 may function as a source contact for electrically connecting PU-1 and PU-2, and the contact 450 may be used for routing the doped source region to the first Vdd line 212 in the first metal layer M1. The contact 452 may function as a source contact for electrically connecting PD1-2 and PD2-2, and the contact 452 may be used for routing the doped source region to the second Vss conductor 216 in the first metal layer M1.

In some embodiments, one or more contact features may also be designed as a long contact in a long rectangular shape with a first dimension along the first direction 492 substantially longer than a second dimension along the second direction 494. The long contact may function as a drain contact for electrically connecting the drains of the PD devices to the corresponding drain of the PU device in the same inverter. The long contact may extend over the first active region 412, the third active region 416, and the second active region 414. For example, a long contact 454 may function as a long drain contact 454 for electrically connecting drains of PD1-1, PU-1 and PD1-2. The long contact 454 may define a first data node (node-1 or data node). A long contact 456 may function as a long drain contact 456 for electrically connecting drains of PD2-1, PU-2, and PD2-2. The long contact 456 may define a second data node (node-2 or data node bar). In some embodiments, the first dimension along the first direction 492 of the long contact, e.g., contact 454 and/or contact 456, is substantially longer than the first dimension along the first direction 492 of the other contact, e.g., contacts 440, 442, 444, 446, 448, 450, and/or 452.

Still referring to FIG. 4B, in some embodiments, one or more contact features in the SRAM cell 400 are designed in a square shape for normal contact function, such as gate contact features 462, 464, 466, 468, 470, and 472. In some embodiments, gate contact features 462, 464, 466, 468, 470, and 472 are routing the gate features to the corresponding metal lines in the first metal layer M1 or the second metal layer M2. For example, the gate contact features 462 and 466 are routing the gate features 420 and 424 to the first word line landing line 202 (WL-A landing line) in the first metal layer M1 respectively. The gate contact features 468 and 472 are routing the gate features 424 and 434 to the second word line landing line 222 (WL-B landing line) in the first metal layer M1 respectively. The gate contact feature 464 is routing the gate feature 426 to the first local interconnect 204 (1$^{st}$ LI), and the gate contact feature 470 is routing the gate feature 428 to the second local interconnect 220 (2$^{nd}$ LI).

Figure 4C:
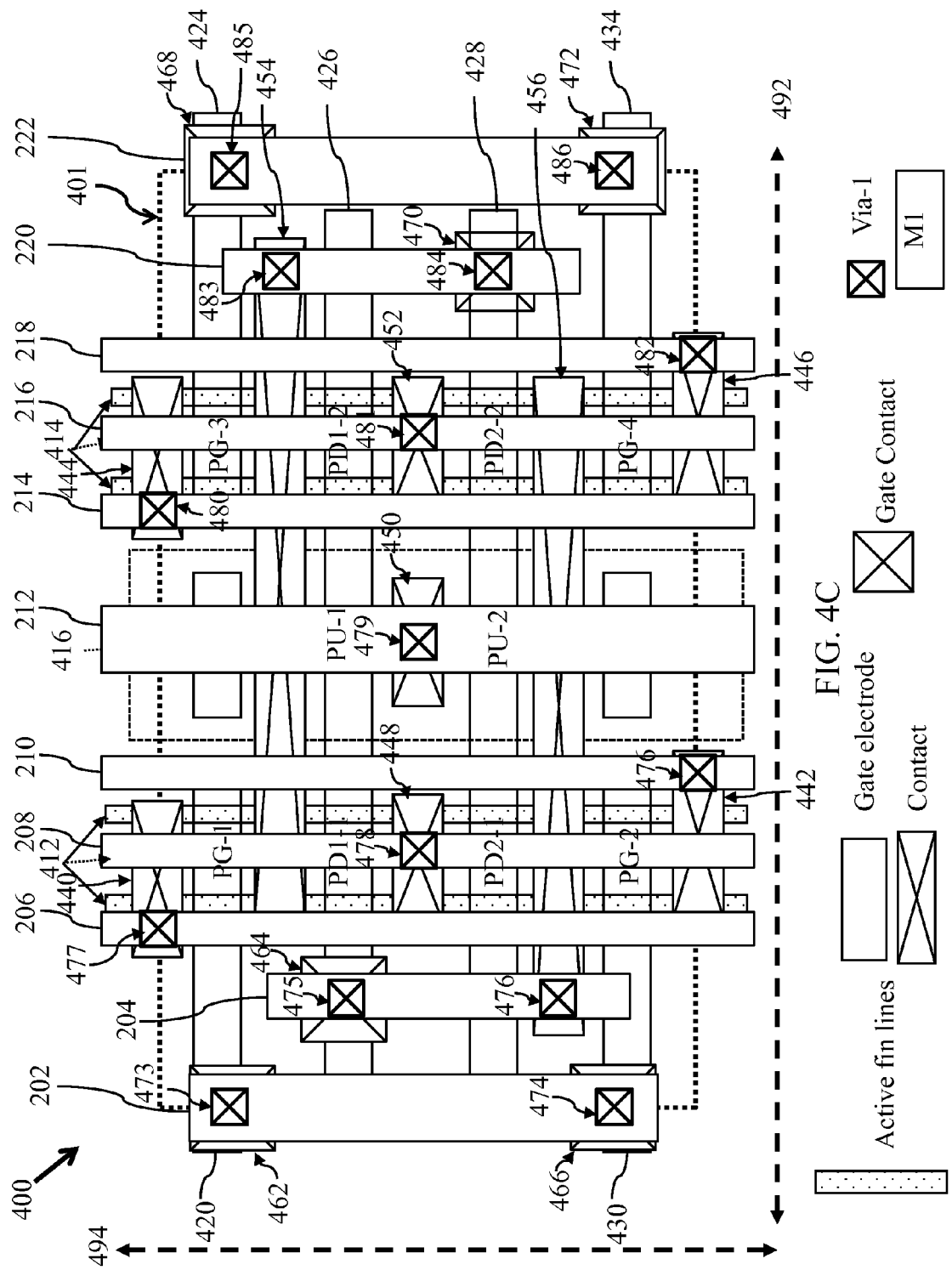

FIG. 4C is a top view of a DP SRAM cell 400 including various devices, contact features, and metal routing structure according to various embodiments of the present disclosure. In one embodiment, the DP SRAM cell 400 includes a metal layer M1 including metal routing structure as discussed in FIGS. 3A-3B. In some embodiments, one or more vias 470-484 (Via-1) may be formed over the first metal layer M1 for electrically connecting the first metal layer M1 to the second metal layer M2.

In some embodiment, the long contact/data node 456 may be connected to gate 426 by the first local interconnect 204 (1$^{st}$ LI). For example, the gate contact 464 may be used to route the gate 426 to the first local interconnect 204 (1$^{st}$ LI) in the first metal layer M1, and the first local interconnect 204 (1$^{st}$ LI) may be electrically connected to the long contact 456. Similarly, the long contact/data node 454 may be connected to gate 428 by the second local interconnect 220 (2$^{nd}$ LI). For example, the gate contact 470 may be used to route the gate 428 to the second local interconnect 220 (2$^{nd}$ LI) in the first metal layer M1, and the second local interconnect 220 (2$^{nd}$ LI) may be electrically connected to the long contact 454. The first local interconnect 204 (LI) and second local interconnect 220 (2$^{nd}$ LI) formed in the first metal layer M1 may be beneficial for forming uniform density and uni-dimensional routing patterns using lithography process.

As shown in FIG. 4C, the one or more gate features and the one or more contact features are formed to extend along the first direction 492. The one or more fin active lines and the one or more metal lines in the metal layer are formed to extend along the second direction 494 which is substantially perpendicular to the first direction 492.

Figure 5A:
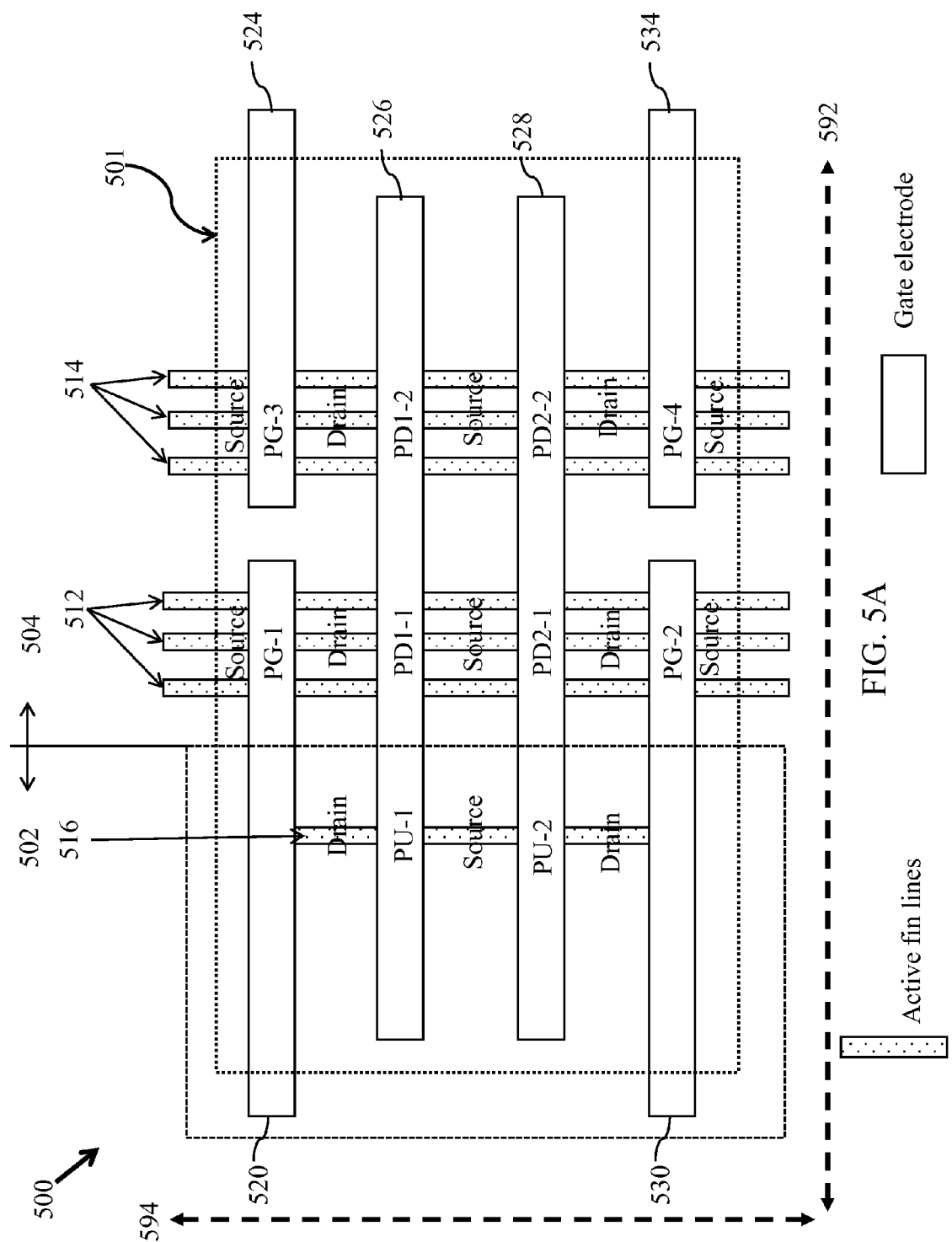
FIGS. 5A-5C are top views of a DP SRAM cell constructed according to some embodiments of the present disclosure.
Figure 5B:
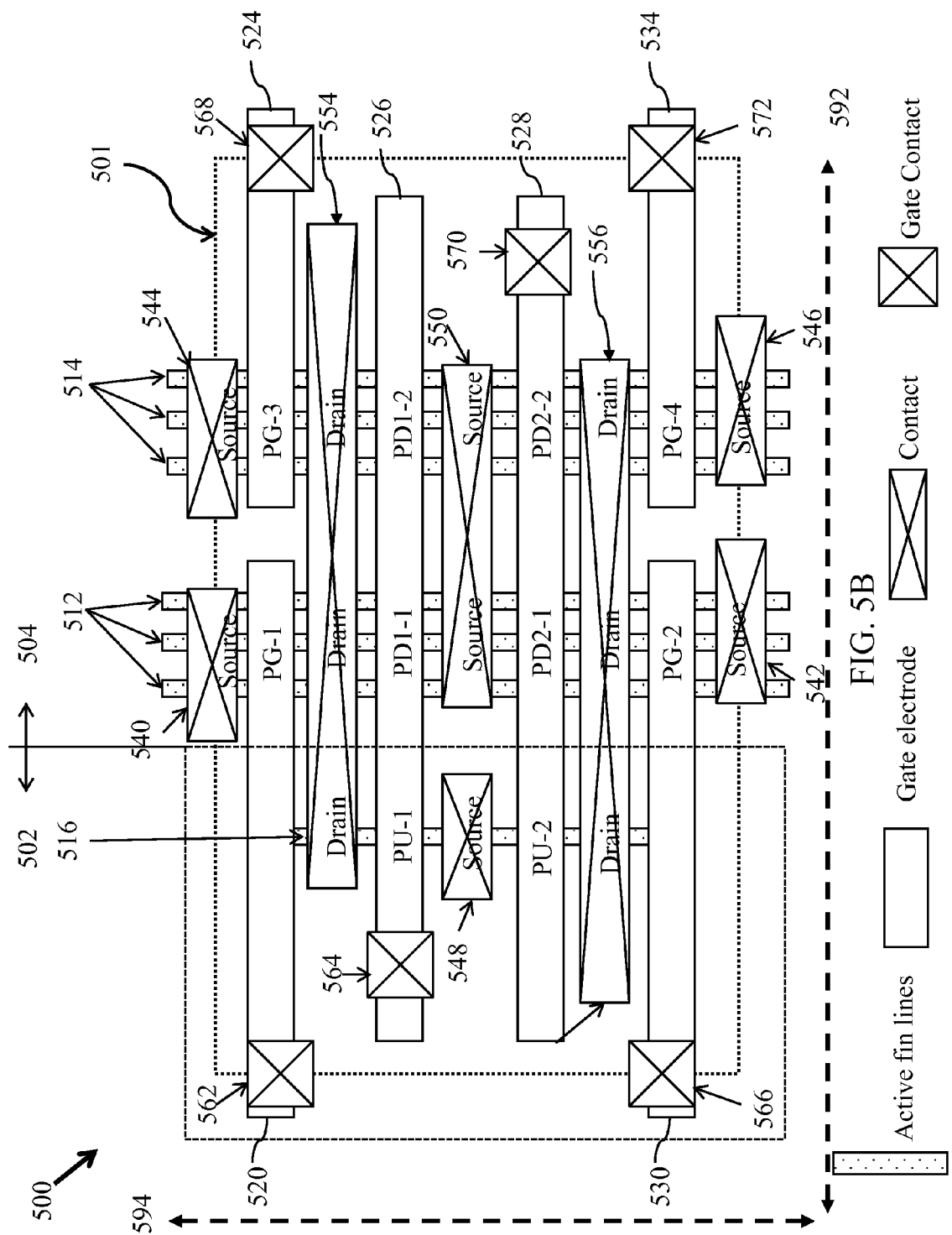
Figure 5C:
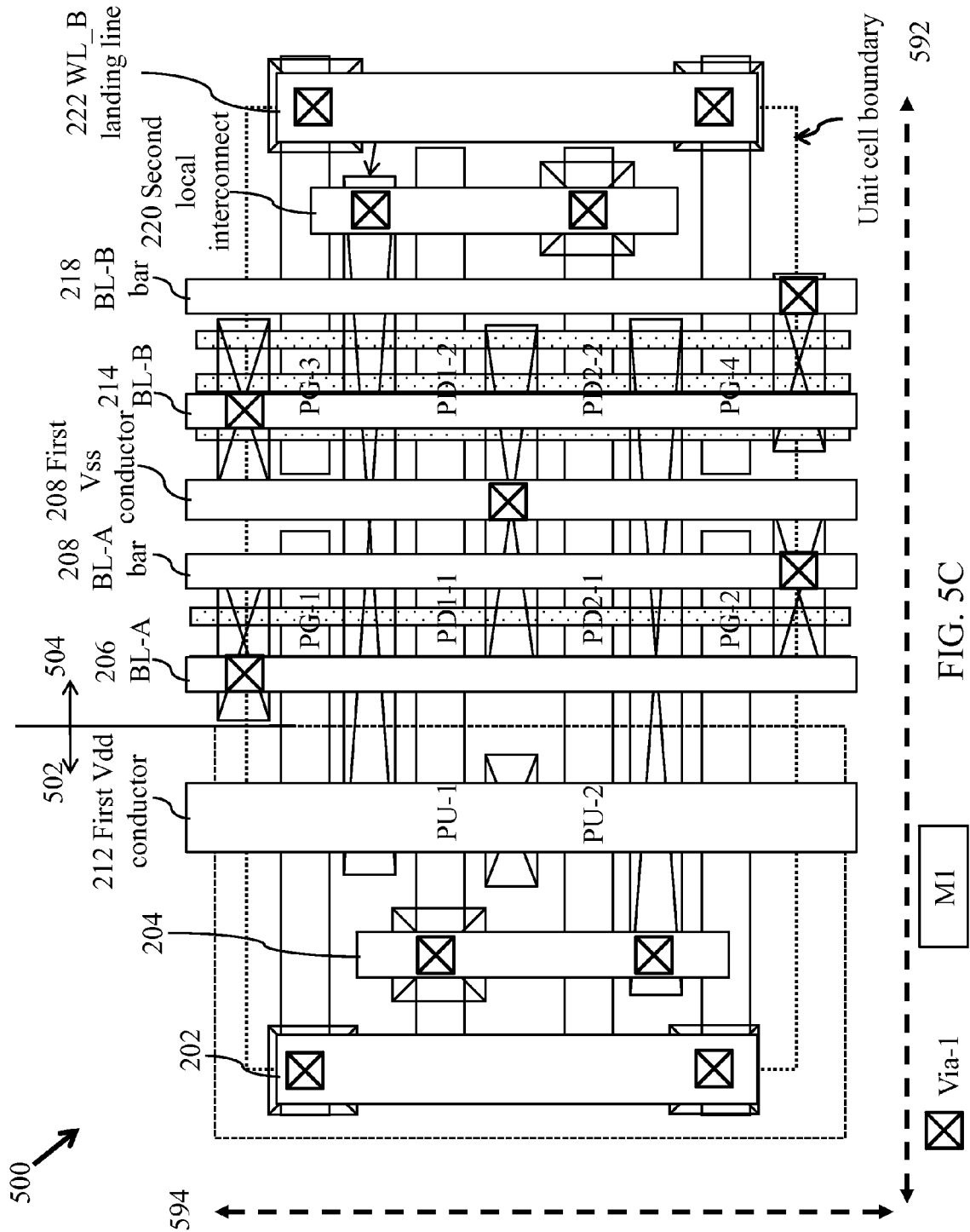

FIGS. 5A-5C are top views of a DP SRAM cell 500 constructed according to some embodiments of the present disclosure. The DP SRAM cell 500 may include semiconductor features and devices that are substantially similar to that of the DP SRAM cell 400. Different from the DP SRAM cell 400 as discussed in FIGS. 4A-4C, the DP SRAM cell 500 includes an N-well region 502 disposed on one side of the cell, and P-well region 504 disposed adjacent to the N-well region 502 in the cell. The N-Well region 502 and the P-well region 504 may be extended to multiple cells beyond the unit cell boundary. For example, the N-Well region 502 and P-well region 504 may be extended to more than one cell along the direction 594.

Still referring to FIG. 5A, the DP SRAM cell 500 may include a first active region 512 and a second active region 514 formed in the P-well region 504, and a third active region 516 formed in the N-well region 502 and disposed on one side of the cell. Each of the first active region 512 and the second active region 514 may include one or more fin active features configured to form various FinFETs. The one or more fin active features of the first active region, the one or more fin active features of the second active region, and the fin active feature of the third active region may extend along the second direction 594 in the PD SRAM cell 500.

Further as shown in FIG. 5A, various gates are formed to orient in the first direction 592 and configured with the active regions to form the PU devices, PD devices and PG devices. In the present embodiment, a gate 520 is disposed over the one or more fin active features of the first active region 512 to form PG-1, a gate 524 is disposed over the one or more fin active features of the second active region 514 to form PG-3, a gate 530 is disposed over the one or more fin active features of the first active region 512 to form PG-2, and a gate 434 is disposed over the one or more fin active features of the second active region 514 to form PG-4. A long gate 526 is formed to extend over the third active region 516, the first active region 512, and the second active region 514 to form PU-1, PD1-1, and PD1-2 of the first inverter respectively. Similarly, a long gate 528 is formed to extend over the third active region 516, the first active region 512, and the second active region 514 to form PU-2, PD2-1, and PD2-2 of the second inverter respectively. In some embodiments as shown in FIG. 5A, each length of the gates 520, 524, 530, and 534 is substantially shorter than each length of the gates 526 and 528. As shown in FIGS. 5A-5C, the PU-1 and PU-2 are formed in the third active region 516, the PG-1, PD1-1, PD2-1 and PG-2 are formed in the first active region 512, and the PG-3, PD1-2, PD2-2, and PG-4 are formed in the second active region 514.

Still referring to FIG. 5A, various interconnect structures may be utilized to couple the nFinFETs and pFinFETs to form the functional DP SRAM cell. In some embodiments, the drain of PG-1 may be electrically connected to the drain of the PD1-1 by sharing a common doped region defined in the one or more fin active features of the first active region 512 and positioned between the PG-1 and PD1-1. The drain of PG-2 may be electrically connected to the drain of the PD2-1 by sharing a common doped region defined in the one or more fin active features of the first active region 512 and positioned between the PG-2 and PD2-1. The source of the PD1-1 and PD2-1 may be formed as a common doped source region defined in the one or more fin active features of the first active region 512 and positioned between the PD1-1 and PD2-1.

Similarly, in some embodiments, the drain of PG-3 may be electrically connected to the drain of the PD1-2 by sharing a common doped region defined in the one or more fin active features of the second active region 514 and positioned between the PG-3 and PD1-2. The drain of PG-4 may be electrically connected to the drain of the PD2-2 by sharing a common doped region defined in the one or more fin active features of the second active region 514 and positioned between the PG-4 and PD2-2. The source of the PD1-2 and PD2-2 may be formed as a common doped source region defined in the one or more fin active features of the second active region 514 and positioned between the PD1-2 and PD2-2.

Referring to FIG. 5B, the DP SRAM cell 500 further includes various contacts on gates, source regions, and/or drain regions. In some embodiments, one or more contact features are designed in a rectangular shape oriented in the first direction 592 to function as source contacts to electrically connecting the doped regions to one or more metal lines. For example, the contact 540 may function as a source contact for routing the doped source region of PG-1 to the first bit line (BL-A) in the first metal layer M1. The contact 542 may function as a source contact for routing the doped source regions of PG-2 to the first bit line bar (BL-A bar) in the first metal layer M1. The contact 544 may function as a source contact for routing the doped source regions of PG-3 to the second bit line (BL-B) in the first metal layer M1. The contact 546 may function as a source contact for routing the doped source regions of PG-4 to the second bit line bar (BL-B bar) in the first metal layer M1. The contact 548 may function as a source contact for routing the doped source regions of PU-1 and PU-2 to the first Vdd line. A source contact 550 may be formed for electrically connecting the doped source regions of PD1-1, PD2-1, PD1-2, and PD2-1, and for routing the doped source regions to the first Vss line and the second Vss line in the first metal layer M1. The source contact 550 may extend over the first active region 512 and the second active region 514. The source contact 550 may be longer than any of the contacts 540-546.

In some embodiments, one or more long contacts may be designed to extend along the first direction 592 over the third active region 516, the first active region 512, and the second active region 514. The long contacts may function as drain contacts to electrically connect the drains of the PD devices and/or the PU device in the same inverter. For example, a long contact 554 may electrically connect drains of PD1-1, PU-1 and PD1-2, and may define a first data node (node-1 or data node). A long contact 556 may electrically connect drains of PD2-1, PU-2, and PD2-2, and may define a second data node (node-2 or data node bar).

In some embodiments, one or more square shaped gate contacts may also be formed for routing the gate features to the corresponding metal lines in the first metal layer M1 or the second metal layer M2. For example, the gate contact 562 and the gate contact 566 may route the gate 520 and the gate 530 to the first word line WL-A respectively. The gate contact 568 and the gate contact 572 may route the gate 524 and the gate 534 to the second word line WL-B respectively. The gate contact 564 may route the long gate 526 to the first local interconnect, and the gate contact 570 may route the long gate 528 to the second local interconnect.

FIG. 5C is a top view of a DP SRAM cell 500 including the device layout as discussed in FIGS. 5A-5B, and a metal layer including metal routing structure constructed accordingly. In some embodiments, one or more vias (Via-1) may be formed over the first metal layer M1 for electrically connecting the first metal layer M1 and the second metal layer M2.

In some embodiments as shown in FIG. 5C, because the layout of the N-well and P-well is different from that of FIG. 4C, the metal lines formed in the first metal layer M1 of the PD SRAM cell 500 may have different layout sequence from that of FIG. 4C. In some embodiments, the metal lines routing in the first metal layer M1 may include a first word line landing line 202 (WL-A landing line), a first local interconnect 204 (LI), a first Vdd line 212, a first bit line 206 (BL-A), a first bit line bar 208 (BL-A bar), a first Vss line 208, a second bit line 214 (BL-B), a second bit line bar 218 (BL-B bar), a second local interconnect 220 (LI), and a second word line landing line 222 (WL-B landing line). The first word line landing line 202 (WL_A landing line) and the second word line landing line 222 (WL-B line) may be on the boundary 501 of the bit cell 500 as shown in FIG. 5C. The first Vdd line 212 may be positioned in the N-well 502 of the PD SRAM cell 500. In some embodiments, the first Vss line 208 may be positioned between the first port (port-A) and the second port (port-B) to avoid cross-talk between the two ports. In some embodiments, the metal lines are arranged in the first metal layer M1 in a sequence as discussed with regard to FIG. 5C.

In some embodiments as shown in FIGS. 4A-4C and 5A-5C, in each unit cell, there are substantially three groups of fin active regions along the first direction 492 or 592 (X-pitch), and four rows of gates along the second direction 494 or 594 (Y-pitch). Therefore, the cell height along the second direction (Y-pitch) may be substantially equal to four gate-pitch.

As shown in FIG. 5C, the one or more gate features and the one or more contact features are formed to extend along the first direction 592. The one or more fin active lines and the one or more metal lines in the metal layer are formed to extend along the second direction 594 which is substantially perpendicular to the first direction 592.

Figure 6A:
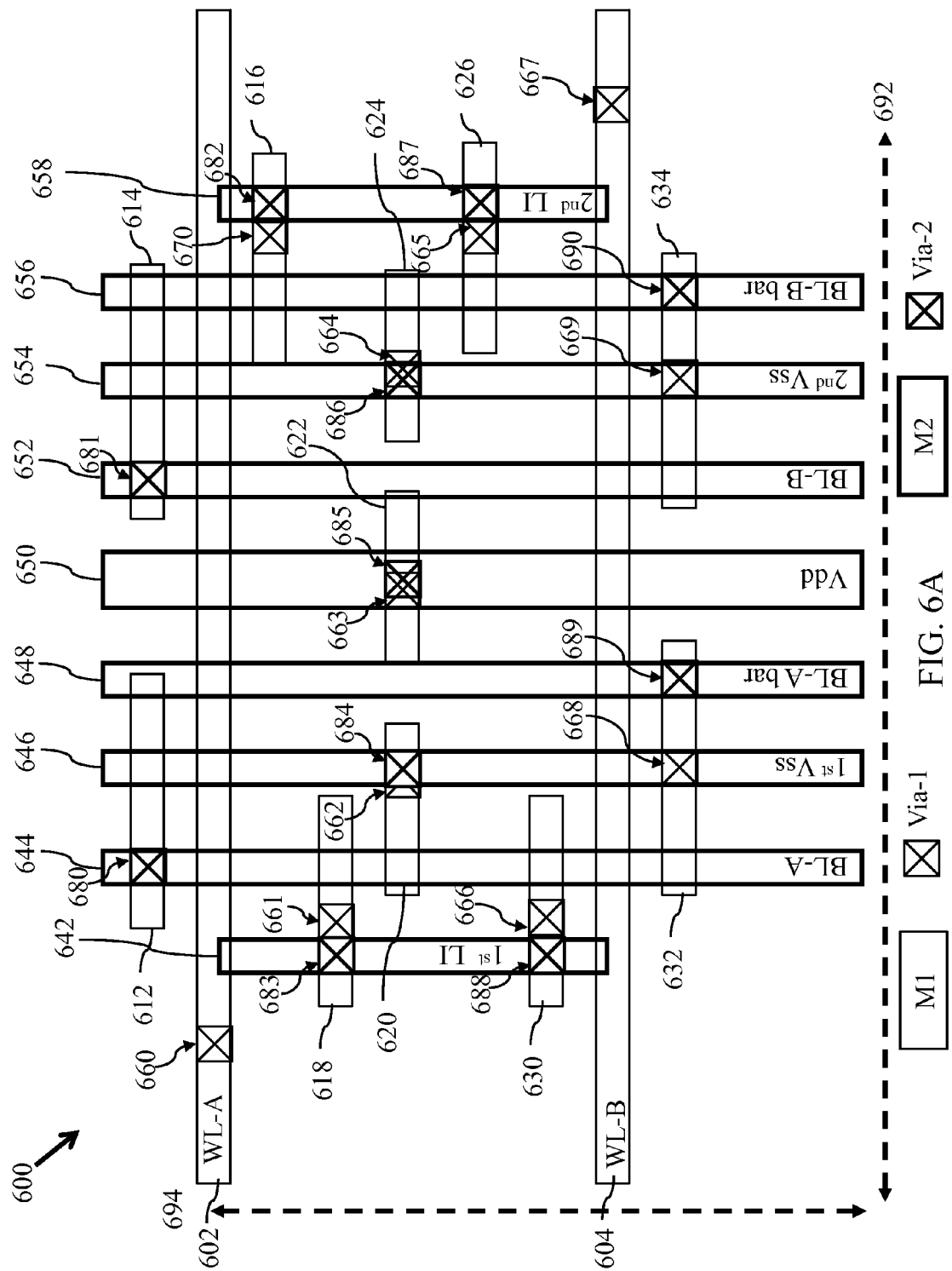
FIGS. 6A-6B are top views of a portion of a DP SRAM cell constructed according to some embodiments of the present disclosure.
Figure 6B:
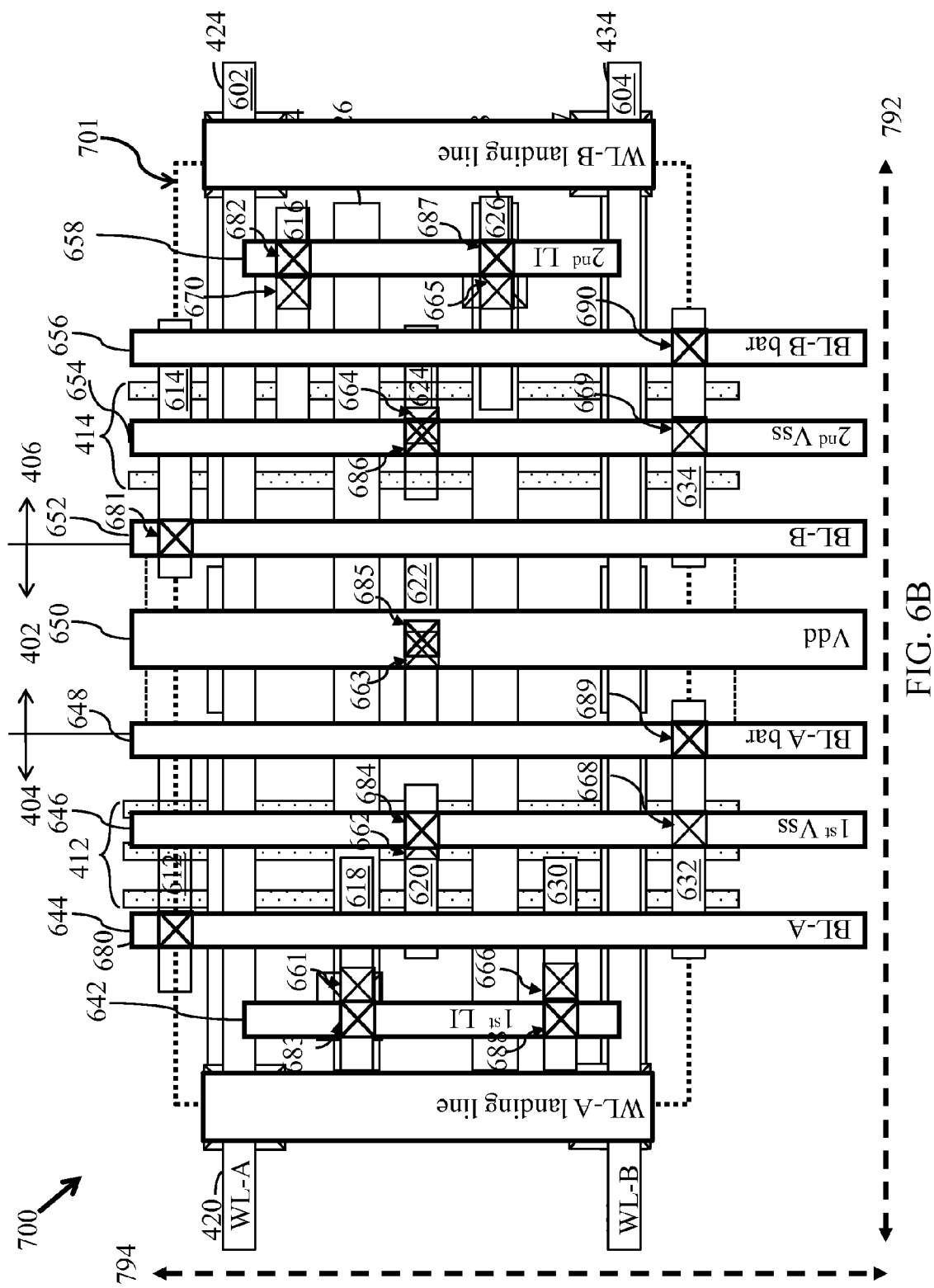

FIGS. 6A-6B are top views of a portion of a DP SRAM cell constructed according to some embodiments of the present disclosure. Referring to FIG. 6A, the metal routing structure 600 of a DP SRAM cell includes more than one metal layers, e.g., the first metal layer M1 and the second metal layer M2, each having metal lines for word line routing. As shown in FIG. 6A, the metal lines in the first metal layer M1 are substantially aligned along a first direction 692. The metal lines in the first metal layer M1 may be substantially parallel to each other. The metal lines in the first metal layer M1 may include a first word line 602 (WL-A) and a second word line 604 (WL-B). One or more short metal lines 612-634 may also be formed in the first metal layer M1. The one or more short metal lines 612-634, the first word line 602, and the second word line 604 may be electrically connected to the second metal layer M2 using the one or more first vias 660-670 (Via-1) formed over the first metal layer M1.

In some embodiments as shown in FIG. 6A, a second metal layer M2 may be formed over the first metal layer M1. The metal lines in the second metal layer M2 are substantially aligned along a second direction 694 which is substantially perpendicular to the first direction 692. The metal lines in the second metal layer M2 may be parallel to each other. In some embodiments, the layout of the metal lines in the second metal layer M2 may be in a sequence of: the first local interconnect 642 ($1^{st}$ LI), the first bit line 644 (BL-A), the first Vss line 646, the first bit line bar 648 (BL-A bar), the first Vdd line 650, the second bit line 652 (BL-B), the second Vss line 654, second bit line bar 656 (BL-B bar), and the second local interconnect 658 ($2^{nd}$ LI). One or more second vias 680-690 (Via-2) may be formed over the second metal layer M2 for electrically connecting the second metal layer M2 to the metal layers formed there above.

Referring to FIG. 6B, the DP SRAM cell 700 includes one or more gate features formed along the same direction as the metal lines in the first metal layer M1. In the some embodiments, the formation of the PG devices, the PU devices, the PD devices, and the one or more contacts are substantially similar to the corresponding devices and/or contacts as discussed in FIGS. 4A-4B.

As shown in FIG. 6B, the one or more gate features, the one or more contact features, and the metal lines in the first metal layer M1 are formed to extend along the first direction 792. The one or more fin active lines and the one or more metal lines in the second metal layer M2 are formed to extend along the second direction 794 which is substantially perpendicular to the first direction 792.

Figure 7A:
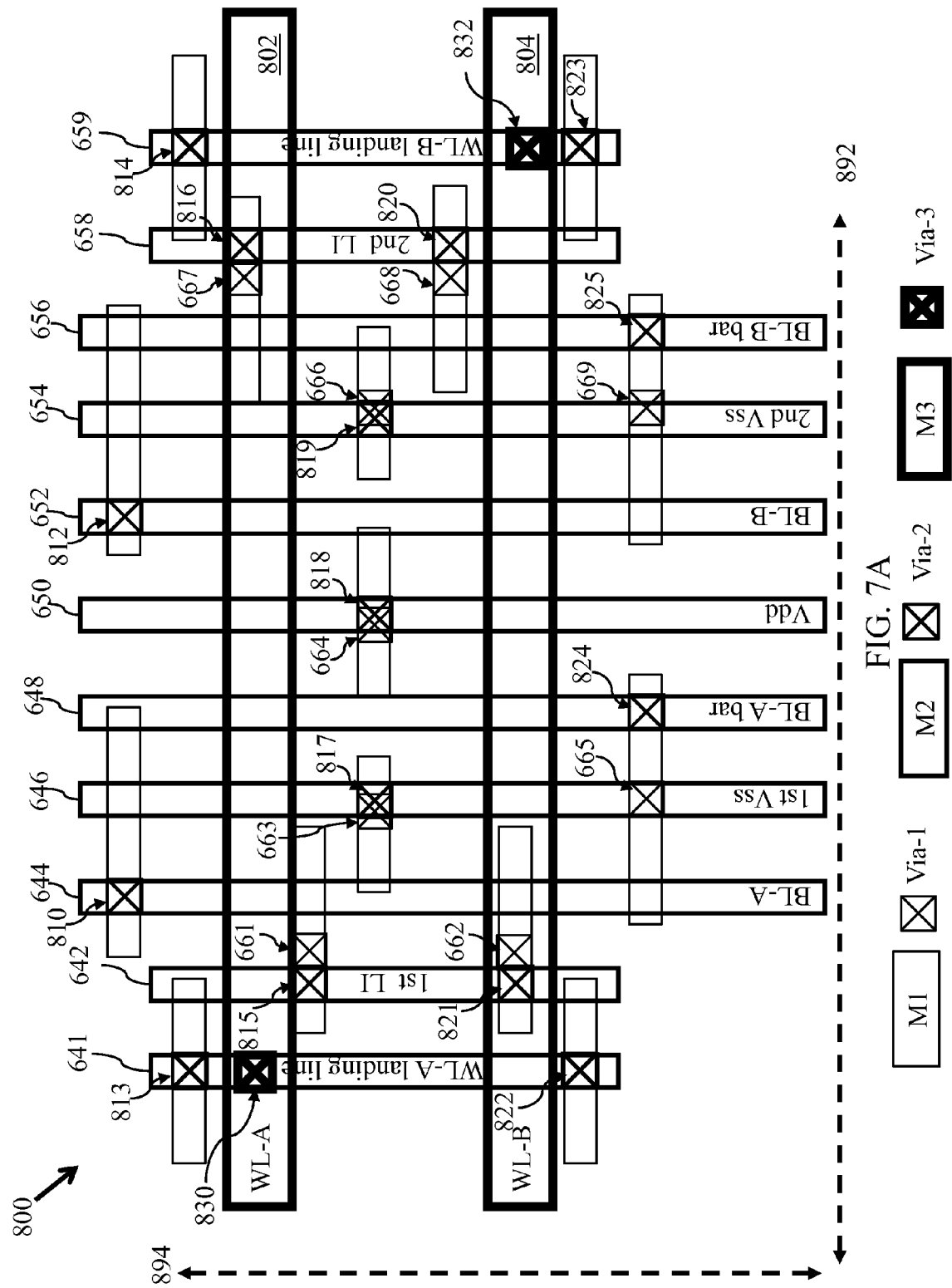
FIGS. 7A-7B are top views of a portion of a DP SRAM device constructed according to some embodiments of the present disclosure.
Figure 7B:
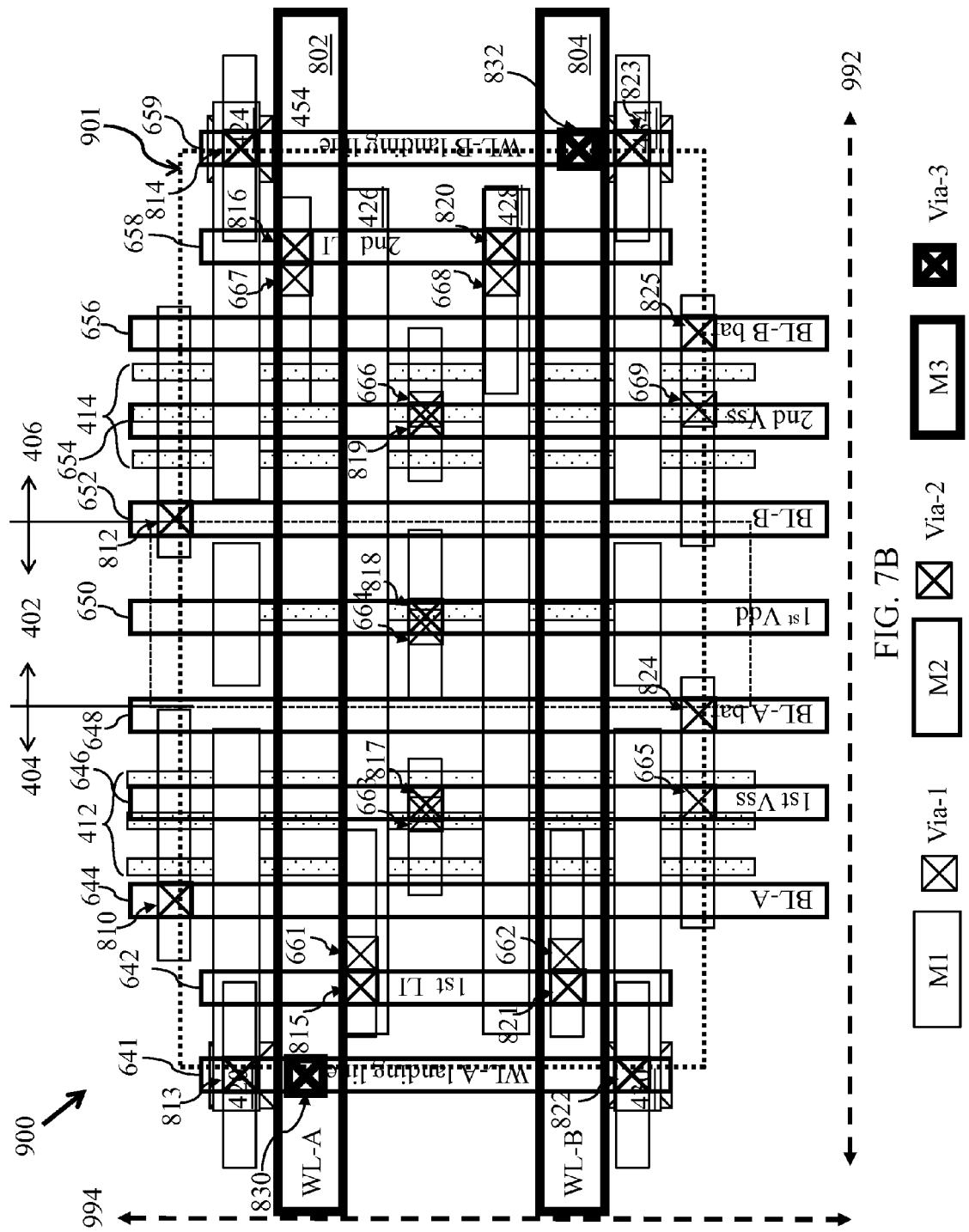

FIGS. 7A-7B are top views of a portion of a DP SRAM device constructed according to some embodiments of the present disclosure. Referring to FIG. 7A, the metal routing structure 800 of a DP SRAM cell includes more than one metal layers each including various metal lines for word line routing. As shown in FIG. 7A, the metal lines in the first metal layer M1 are substantially aligned along a first direction 892. The metal lines in the first metal layer M1 may be substantially parallel to each other. The metal lines in the first metal layer M1 may include one or more short metal lines electrically connected to the second metal layer M2 using the one or more first vias (Via-1) formed over the first metal layer M1. The one or more short metal lines in the first metal layer M1 and the one or more first vias 661-669 (Via-1) are substantially similar to the short metal lines and the first vias as discussed in FIG. 6A.

In some embodiments as shown in FIG. 7A, a second metal layer M2 may be formed over the first metal layer M1. The metal lines in the second metal layer M2 are substantially aligned along a second direction 894 which is substantially perpendicular to the first direction 892. The metal lines in the second metal layer M2 may be substantially parallel to each other. In some embodiments, the layout of the metal lines in the second metal layer M2 may be in a sequence of: the first word line landing line 641 (WL-A landing line), the first local interconnect 642 (1$^{st}$ LI), the first bit line 644 (BL-A), the first Vss line 646, the first bit line bar 648 (BL-A bar), the first Vdd line 650, the second bit line 652 (BL-B), the second Vss line 654, second bit line bar 656 (BL-B bar), the second local interconnect 658 (2$^{nd}$ LI), and the second word line landing line 659 (WL-B landing line). One or more second vias 810-825 (Via-2) may be formed over the second metal layer M2 for electrically connecting the second metal layer M2 to the metal layers formed there above. The second metal layer M2 and the metal lines formed in the second metal layer M2 may be substantially similar to those of FIG. 6A.

Still referring to FIG. 7A, a third metal layer M3 may be formed over the second metal layer M2. In some embodiments, the third metal layer M3 may include a first word line 802 (WL-A) of port A, and a second word line 804 (WL-B) of port B. The first word line 802 and the second word line 804 may be formed along the first direction 892, which are substantially parallel to the metal lines in the first metal layer M1, and are substantially perpendicular to the metal lines in the second metal layer M2. One or more third vias 830 and 832 (Via-3) may be formed over the third metal layer M3.

Referring to FIG. 7B, the DP SRAM cell 900 includes one or more gate features formed along the same direction 892 as the metal lines in the first metal layer M1 and the first word line 802 and second word line 804 in the third metal layer M3. In the some embodiments, the formation of the PG device, the PU devices, the PD devices, and the one or more contacts are substantially similar to the corresponding devices as discussed in FIGS. 4A-4B.

As shown in FIG. 7B, the one or more gate features, the one or more contact features, the metal lines in the first metal layer M1, and the first and second word lines in the third metal layer M3 are formed to extend along the first direction 892. The one or more fin active lines and the one or more metal lines in the second metal layer M2 are formed to extend along the second direction 894 which is substantially perpendicular to the first direction 892.

Figure 8:
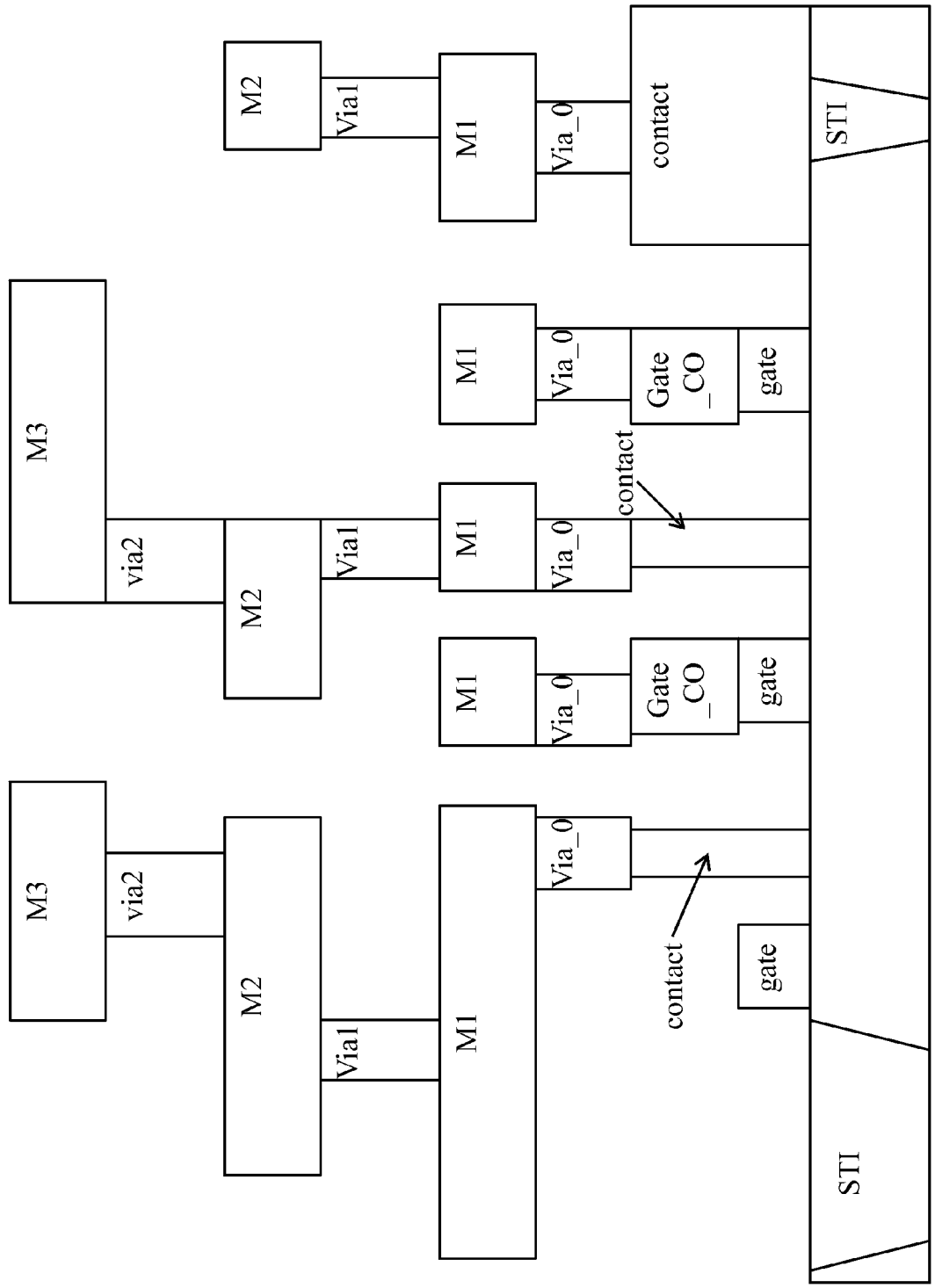
FIG. 8 is a cross sectional view of a portion of a DP SRAM device including multiple metal layers constructed according to some embodiments of the present disclosure.

FIG. 8 is a schematic cross sectional view of a portion of a DP SRAM cell including multiple metal layers, e.g., the first metal layer M1, the second metal layer M2, and the third metal layer M3. One or more vias and contacts may also be illustrated in the cross sectional view of FIG. 8.

The present disclosure provides various embodiments of DP SRAM cell structures and the layouts. One or more advantages may present in the various embodiments of the present disclosure. In some examples, all fin active regions, gate electrodes, long contact, and metal routing lines in each of the metal layers are in straight line shape along a first direction or a second direction perpendicular to the first direction. This is lithography friendly and supportive for spacer lithography process. No wide island or bent metal lines are necessary in the metal routing layout. In some examples, the PD SRAM cell includes a fully balance device layout to provide cell stability improvement. In some examples, the same metal routing scheme may be used for both logical circuits and the dual port cells. The various embodiments of the present disclosure may support future single orientation metal routing requirement. The metal routing structure discussed in the present disclosure may be beneficial for lithography patterning to provide uniform density and uni-dimensional routing in the patterns.

The present disclosure provides a static random access memory (SRAM) cell. The SRAM cell comprises a first inverter including a first pull-up (PU) device, a first pull-down (PD) device, and a second PD device; a second inverter cross-coupled to the first inverter, the second inverter including a second PU device, a third PD device, and a fourth PD device; first and second pass gate (PG) devices coupled to the first inverter to form a first port; third and fourth PG devices coupled to the second inverter to form a second port. The first and second PG devices, the first PD device of the first inverter, and the third PD device of the second inverter are configured on a first active region. The third and fourth PG devices, the second PD device of the first inverter, and the fourth PD device of the second inverter are configured on a second active region. The first PU device and the second PU device are configured on a third active region.

The present disclosure provides a static random access memory (SRAM) cell. The SRAM cell comprises a first inverter cross-coupled to a second inverter; first and second pass-gate (PG) devices coupled to the first inverter to form a first port; third and fourth PG devices coupled to the second inverter to form a second port; a first group of metal lines formed in a first metal layer and coupled to the first inverter, the second inverter, the first PG device, the second PG device, the third PG device, and the fourth PG device. The first group of metal lines are formed parallel to each other and arranged along a first direction in a sequence of a first word line (WL) landing line, a first local interconnect (LI) line, a first bit line (BL), a first Vss line, a first bit line (BL) bar, a first Vdd line, a second BL, a second Vss line, a second BL bar, a second LI line, and a second word line (WL) landing line.

The present disclosure provides a static random access memory (SRAM) cell. The SRAM cell comprises a first pull-up (PU) device, a first pull-down (PD) device, and a second PD device formed in a first continuous feature extending along a first dimension; a second PU device, a third PD device, and a fourth PD device formed in a second continuous feature extending along the first dimension; a first pass-gate (PG) device and a second PG device coupled to the first PU device, the first PD device, and the second PD device to form a first port; and a third PG device and a fourth PG devices coupled to the second PU device, the third PD device, and the fourth PD device to form a second port. A dimension of the SRAM cell along a second direction is substantially equal to four gate pitch, and the second direction is substantially perpendicular to the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) cell, comprising:
   a first inverter including a first pull-up (PU) device, a first pull-down (PD) device, and a second PD device;
   a second inverter cross-coupled to the first inverter, the second inverter including a second PU device, a third PD device, and a fourth PD device;
   first and second pass gate (PG) devices coupled to the first inverter to form a first port; and
   third and fourth PG devices coupled to the second inverter to form a second port;
   wherein the first and second PG devices, the first PD device, and the third PD device are configured on a first active region,
   wherein the third and fourth PG devices, the second PD device, and the fourth PD device are configured on a second active region, and
   wherein the first PU device and the second PU device are configured on a third active region.

2. The SRAM cell of claim 1, wherein the first active region, the second active region, and the third active region are arranged in parallel to each other along a first direction,
   wherein a first p-well is configured in the first active region, a second p-well is configured in the second active region, and an n-well is configured in the third active region, and
   wherein the third active region is disposed between the first active region and the second active region.

3. The SRAM cell of claim 2, wherein a first long contact is formed to electrically connect drains of the first PG device, the first PD device, the first PU device, the second PD device, and the third PG device,
   wherein the first long contact has a first dimension extending along the first direction over the first p-well, the n-well, and the second p-well, and a second dimension extending along a second direction substantially perpendicular to the first direction, and
   wherein the first dimension is greater than the second dimension.

4. The SRAM cell of claim 3, wherein a second long contact is formed to electrically connect drains of the second PG device, the third PD device, the second PU device, the fourth PD device, and the fourth PG device,
   wherein the second long contact has a first dimension extending along the first direction over the first p-well, the n-well, and the second p-well, and a second dimension extending along the second direction, and
   wherein the first dimension is greater than the second dimension.

5. The SRAM cell of claim 1, wherein each of the first PU device, the second PU device, the first PD device, the second PD device, the third PD device, the fourth PD device, the first PG device, the second PG device, the third PG device, and the fourth PG device includes a fin field-effect transistor (FinFET).

6. The SRAM cell of claim 5, wherein each of the first PG device, the second PG device, the first PD device, the second PD device, the third PD device, and the fourth PD device includes an n-type FinFET.

7. The SRAM cell of claim 2, further comprising a first metal layer formed over the first inverter and the second inverter, the first metal layer including a plurality of metal lines arranged parallel to each other along the first direction,
   wherein the plurality of the metal lines are arranged in a sequence of:
   a first word line (WL) landing line,
   a first local interconnect (LI) line,
   a first bit line (BL),
   a first Vss line,
   a first bit line (BL) bar,
   a first Vdd line;
   a second BL,
   a second Vss line,
   a second BL bar,
   a second LI line, and
   a second word line (WL) landing line.

8. The SRAM cell of claim 7, further comprising a second metal layer formed over the first metal layer, the second metal layer including a plurality of metal lines arranged parallel to each other along a second direction substantially perpendicular to the first direction,
   wherein the plurality of the metal lines in the second metal layer includes:
   at least two word lines,
   at least one Vss line, and
   at least one Vdd line.

9. The SRAM cell of claim 1, wherein an n-well is configured in the third active region, and a p-well is configured in the first active region and the second active region, the p-well being disposed adjacent to the n-well, and
   wherein the SRAM cell further comprises a first metal layer including a plurality of metal lines arranged parallel to each other in a sequence of:
   a first word line (WL) landing line,
   a first local interconnect (LI) line,
   a first Vdd line,
   a first bit line (BL),
   a first bit line (BL) bar,
   a first Vss line,
   a second BL,
   a second BL bar,
   a second LI line, and
   a second word line (WL) landing line.

10. A static random access memory (SRAM) cell, comprising:
   a first inverter cross-coupled to a second inverter;

first and second pass-gate (PG) devices coupled to the first inverter to form a first port;
third and fourth PG devices coupled to the second inverter to form a second port;
a first group of metal lines formed in a first metal layer and coupled to the first inverter, the second inverter, the first PG device, the second PG device, the third PG device, and the fourth PG device,
wherein the first group of metal lines are formed parallel to each other and arranged along a first direction in a sequence of:
a first word line (WL) landing line,
a first local interconnect (LI) line,
a first bit line (BL),
a first Vss line,
a first bit line (BL) bar,
a first Vdd line,
a second BL,
a second Vss line,
a second BL bar,
a second LI line, and
a second word line (WL) landing line.

11. The SRAM cell of claim 10, further comprising:
the first inverter including a first pull-up (PU) device and a first pull-down (PD) device and a second PD device;
the second inverter being cross-coupled to the first inverter, the second inverter including a second PU device and a third PD device and a fourth PD device;
wherein the first and second PG devices, the first PD device, and the third PD device are configured on a first active region,
wherein the third and fourth PG devices, the second PD device of the first inverter, and the fourth PD device are configured on a second active region, and
wherein the first PU device and the second PU device are configured on a third active region.

12. The SRAM cell of claim 11, further comprising:
a first long contact formed to electrically connect drains of the first PG device, the first PD device, the first PU device, the second PD device, and the third PG device, and
a second long contact formed to electrically connect drains of the second PG device, the third PD device, the second PU device, the fourth PD device, and the fourth PG device,
wherein each of the first long contact and the second long contact has a first dimension extending along the first direction across the first active region, the second active region, and the third active region, and a second dimension extending along a second direction substantially perpendicular to the first direction, the first dimension being substantially greater than the second dimension,
wherein the first LI line is electrically connected to the second long contact, and
wherein the second LI line is electrically connected to the first long contact.

13. The SRAM cell of claim 12, wherein a first gate of the first PD device, a second gate of the first PU device, and a third gate of the second PD device are configured in a first continuous feature having a first dimension along the first direction and a second dimension along the second direction, the first dimension of the first continuous feature being substantially greater than the second dimension of the first continuous feature, and
wherein a fourth gate of the third PD device, a fifth gate of the second PU device, and a sixth gate of the fourth PD device are configured in a second continuous feature having a first dimension along the first direction and a second dimension along the second direction, the first dimension of the second continuous feature being substantially greater than the second dimension of the second continuous feature.

14. The SRAM cell of claim 10, further comprising a second group of metal lines formed in a second metal layer over the first metal layer, the second group of metal lines being parallel to each other and arranged along a second direction substantially perpendicular to the first direction,
wherein the second group of the metal lines includes:
a third Vss line,
the first WL,
a second Vdd line,
the second WL, and
a fourth Vss line, and
wherein the third Vss line, the fourth Vss line are located at boundary lines of the SRAM cell and are being shared by an adjacent SRAM cell.

15. The SRAM cell of claim 14, wherein the first WL in the second metal layer is electrically connected to a first gate formed under the first metal layer using the first WL landing line in the first metal layer, and
wherein the second WL in the second metal layer is electrically connected to a second gate formed under the first metal layer using the second WL landing line in the first metal layer.

16. The SRAM cell of claim 12, wherein the first long contact is configured to be a data node, and the second long contact is configured to be a data node bar,
wherein sources of the first PD device and the third PD device are physically and electrically connected to form a first source contact configured to connect to the first Vss line,
wherein sources of the second PD device and the fourth PD device are physically and electrically connected to form a second source contact configured to connect to the second Vss line, and
wherein sources of the first PU device and the second PU device are physically and electrically connected to form a third source contact configured to connect to the first Vdd line.

17. The SRAM cell of claim 10, further comprising a second group of metal lines formed in a second metal layer over the first metal layer, the second group of metal lines being parallel to each other and arranged along a second direction substantially perpendicular to the first direction,
wherein the second group of the metal lines includes:
a second Vdd line,
the first WL,
a third Vss line,
the second WL, and
a third Vdd line,
wherein the second Vdd line and the third Vdd line are located at boundary lines of the SRAM cell and are being shared by an adjacent SRAM cell.

18. The SRAM cell of claim 10, further comprising:
a second metal layer formed under the first metal layer; and
a third metal layer formed over the first metal layer,
wherein the first second metal layer includes a plurality of short metal lines arranged along a second direction substantially perpendicular to the first direction, the short metal lines extending along the first direction and including at least one Vss line and at least one Vdd line; and wherein the third metal layer includes a first WL and a second WL arranged along the second direction and extending along the first direction.

19. A static random access memory (SRAM) cell, comprising:
- a first pull-up (PU) device, a first pull-down (PD) device, and a second PD device formed in a first continuous feature extending along a first dimension;
- a second PU device, a third PD device, and a fourth PD device formed in a second continuous feature extending along the first dimension;
- a first pass-gate (PG) device and a second PG device coupled to the first PU device, the first PD device, and the second PD device to form a first port; and
- a third PG device and a fourth PG devices coupled to the second PU device, the third PD device, and the fourth PD device to form a second port,
- wherein a dimension of the SRAM cell along a second direction is substantially equal to four gate pitches, the second direction being substantially perpendicular to the first direction
- wherein at least one of the first PU device and the second PU device has a dummy gate.

20. The SRAM cell of claim 19, wherein:
- the first PG device includes a gate disposed over active features of an active region; and
- the second PG includes a gate disposed over active features of the active region.

* * * * *